US008941064B2

(12) United States Patent  
Akin et al.

(10) Patent No.: US 8,941,064 B2  
(45) Date of Patent: Jan. 27, 2015

(54) UNCOOLED INFRARED DETECTOR AND METHODS FOR MANUFACTURING THE SAME

(75) Inventors: Tayfun Akin, Ankara (TR); Selim Eminoglu, Ankara (TR)

(73) Assignee: Mikrosens Elektronik San. ve Tic. A.S., Ankara (TR)

(*) Notice: Subject to any disclaimer, the term of this patent is extended or adjusted under 35 U.S.C. 154(b) by 930 days.

(21) Appl. No.: 13/085,205

(22) Filed: Apr. 12, 2011

(65) Prior Publication Data

US 2011/0248374 A1 Oct. 13, 2011

Related U.S. Application Data

(60) Provisional application No. 61/322,982, filed on Apr. 12, 2010.

(51) Int. Cl.  
*G01J 5/20* (2006.01)
(52) U.S. Cl.  
CPC .......................................... *G01J 5/20* (2013.01)  
USPC ....................................................... 250/338.4
(58) Field of Classification Search  
CPC ................................ H01L 31/02; H01L 25/00  
USPC .................................... 250/332, 338.4, 338.5  
See application file for complete search history.

(56) References Cited

U.S. PATENT DOCUMENTS

| 6,465,784 | B1 | 10/2002 | Kimata | |
| 2005/0224714 | A1* | 10/2005 | Akin et al. | 250/332 |
| 2007/0145274 | A1 | 6/2007 | Iida | |
| 2008/0179525 | A1 | 7/2008 | Ikushima et al. | |
| 2009/0236526 | A1 | 9/2009 | Sasaki et al. | |
| 2009/0266987 | A1 | 10/2009 | Honda et al. | |

(Continued)

FOREIGN PATENT DOCUMENTS

| JP | 2002-296106 | 10/2002 |
| JP | 2002340684 | 11/2002 |

(Continued)

OTHER PUBLICATIONS

Tezcan et al, "A low-cost uncooled infrared microbolometer detector in standard CMOS technology", Feb. 2003, IEEE Transactions on Electronic Devices, vol. 50, No. 2, pp. 494-502.*

(Continued)

*Primary Examiner* — David Porta  
*Assistant Examiner* — Faye Boosalis  
(74) *Attorney, Agent, or Firm* — Snell & Wilmer LLP

(57) ABSTRACT

This disclosure discusses various methods for manufacturing uncooled infrared detectors by using foundry-defined silicon-on-insulator (SOI) complementary metal oxide semiconductor (CMOS) wafers, each of which may include a substrate layer, an insulation layer having a pixel region and a wall region surrounding the pixel region, a pixel structure formed on the pixel region of the insulation layer, a wall structure formed adjacent to the pixel structure and on the wall region of the insulation layer, a dielectric layer covering the pixel structure and the wall structure, a pixel mask formed within the dielectric layer and for protecting the pixel structure during a dry etching process, and a wall mask formed within the dielectric layer and for protecting the wall structure during the dry etching process, thereby releasing a space defined between the wall structure and the pixel structure after the dry etching process.

40 Claims, 14 Drawing Sheets

(56) References Cited

U.S. PATENT DOCUMENTS

2010/0025584 A1  2/2010  Sasaki et al.
2011/0002359 A1  1/2011  Benzel et al.

FOREIGN PATENT DOCUMENTS

| | | |
|---|---|---|
| JP | 2003279406 | 10/2003 |
| JP | 2005-009998 | 1/2005 |
| JP | 2007333558 | 12/2007 |
| JP | 2009-174917 | 8/2009 |
| WO | 2007/147663 | 12/2007 |

OTHER PUBLICATIONS

Eminoglu, Selim et al., "A Low-Cost 128 × 128 Uncooled Infrared Detector Array in CMOS Process"; *Journal of Microelectromechanical Systems*; vol. 17; No. 1; pp. 20-30; Feb. 2008.

Funaki, Hideyuki et al., "A 160 × 120 Pixel Uncooled TEC-less Infrared Radiation Focal Plane Array on a Standard Ceramic Package," Proc. of SPIE; vol. 7298; 9 pages; 2009.

\* cited by examiner

US 8,941,064 B2

UNCOOLED INFRARED DETECTOR AND METHODS FOR MANUFACTURING THE SAME

CROSS REFERENCE TO RELATED APPLICATION

This application claims priority to and the benefit of U.S. Provisional Application No. 61/322,982, entitled "UNCOOLED INFRARED DETECTOR ARRAYS AND METHODS FOR MANUFACTURE," filed on Apr. 12, 2010, which is assigned to the assignee hereof and hereby expressly incorporated by reference herein.

BACKGROUND

1. Field

The present invention generally relates to the field of infrared detectors, and more particularly to uncooled infrared detectors that are manufactured from foundry-defined silicon-on-insulator (SOI) complementary metal oxide semiconductor (CMOS) wafers.

2. Description of the Related Art

An uncooled (thermal) infrared detector is a device including a pixel with an infrared absorption layer (a.k.a. heat absorption layer) and a thermoelectric conversion element. The infrared absorption layer receives and converts an infrared ray (wave) into heat. The thermoelectric conversion element converts the heat into an electric signal that communicates the characteristics of the received infrared ray.

Conventional uncooled infrared detectors may have an array of pixels, each of which may include a single diode for performing the function of the thermoelectric conversion element. Generally, the single diode may have a turn-on voltage that depends on the temperature of the heat absorption layer. When the single diode conducts a constant current, the potential difference across the single diode may vary with the heat converted by the heat absorption layer. As such, the potential difference of the single diode may be used for measuring the intensity of the received infrared ray.

In order to prevent the heat from transferring among pixels, conventional uncooled infrared detectors use various types of closed well structures to thermally isolate each pixel. Typically, a closed well may be formed on the substrate layer, and it may define a cavity that surrounds the pixel. A support structure may be formed between the closed well and the pixel for suspending the pixel within the cavity. The suspended pixel, the closed well, and the support structures may be fabricated on a silicon substrate by using customer-specific fabrication processes.

However, these customer-specific fabrication processes generally involve several iterations of high precision lithography, each of which may be costly and time consuming to perform. Moreover, these customer-specific fabrication processes may suffer from low yield because the failure rates of high precision lithography are statistically high. In exchange for a better yield, some conventional infrared detectors may sacrifice the reliability of the pixels, the closed wells, and/or the support structures.

Thus, there is a need for an uncooled infrared detector with improved quality, higher yield, and lower production cost.

SUMMARY

The present invention may provide several solutions to satisfy the need as identified in the previous section. One of the solutions may include various methods for manufacturing the uncooled infrared detectors by using foundry-defined silicon-on-insulator (SOI) complementary metal oxide semiconductor (CMOS) wafers. Generally, a foundry-defined SOI-CMOS wafer may be fabricated by using a generic SOI-CMOS process (a.k.a. standard SOI-CMOS process).

The generic SOI-CMOS process may be defined and offered by one or more foundries (e.g., fabrication companies that fabricate SOI-CMOS wafers). The generic SOI-CMOS process may fulfill the design requirements of many customers. As such, the generic SOI-CMOS process typically involves standard design rules, process sequence, and/or process parameters, which may reduce the time and cost for fabricating the foundry-defined SOI-CMOS wafers. Moreover, because of its standardization nature, the SOI-CMOS wafers fabricated according to the generic SOI-CMOS process can be adopted by other applications. Due to the economies of scale, the production cost of foundry-defined SOI-CMOS wafers (a.k.a. standard SOI-CMOS wafers) can be substantially reduced.

The manufacturing methods disclosed herein involve a few process steps for modifying the foundry-defined SOI-CMOS wafers. The modification may allow the SOI-CMOS wafers to incorporate the functional and structural features of the uncooled infrared detectors. When compared to conventional lithography and deposition steps, these process steps may be cost efficient and easy to perform because they have a relatively high tolerance margin (a.k.a. non-critical). Advantageously, the methods disclosed herein may allow the cost and yield of the uncooled infrared detectors to be improved tremendously.

In one embodiment, the present invention may be a silicon-on-insulator (SOI) complementary metal oxide semiconductor (CMOS) wafer for use in manufacturing an uncooled microbolometer. The SOI-CMOS wafer may include a substrate layer, an insulation layer formed on the substrate layer, the insulation layer having a pixel region and a wall region surrounding the pixel region, a pixel structure formed on the pixel region of the insulation layer, a wall structure formed adjacent to the pixel structure and on the wall region of the insulation layer, a dielectric layer covering the pixel structure and the wall structure, a pixel mask formed within the dielectric layer, and for protecting the pixel structure during a dry etching process, and a wall mask formed within the dielectric layer, and for protecting the wall structure during the dry etching process, thereby releasing a space defined between the wall structure and the pixel structure after the dry etching process.

In another embodiment, the present invention may provide an infrared detector manufactured from a foundry-defined silicon-on-insulator (SOI) complementary metal oxide semiconductor (CMOS) wafer. The infrared detector may include a plurality of walls forming a through well defining a first opening and a second opening opposing the first opening, an infrared sensor configured to detect an infrared wave passing through one of the first opening or the second opening of the through well, and a support arm connecting the sensor to at least one of the plurality of walls so as to suspend the infrared sensor within the through well and adjacent to the first opening.

In another embodiment, the present invention may provide a method for manufacturing an uncooled infrared detector from a foundry-defined silicon-on-insulator (SOI) complementary metal oxide semiconductor (CMOS) wafer having a substrate layer, an insulation layer formed on the substrate layer and having a pixel region and a wall region surrounding the pixel region, a pixel structure formed on the pixel region of the insulation layer, a wall structure formed adjacent to the pixel structure and on the wall region of the insulation layer, a dielectric layer covering the pixel structure and the wall structure, a pixel mask formed within the dielectric layer and covering the pixel structure, and a wall mask formed within the dielectric layer and covering the wall structure. The method may include the steps of performing a first vertical etching through a portion of the substrate layer to define a back pixel space terminated by the pixel region of the insulation layer, performing a second vertical etching through a portion of the dielectric layer not covered by the pixel mask and the wall mask and through a portion of the insulation layer not covered by the pixel mask and the wall mask, so as to define a front pixel space for separating the pixel structure from the wall structure, and removing the pixel mask and the wall mask.

In yet another embodiment, the present invention may provide a method for manufacturing an uncooled infrared detector from a foundry-defined silicon-on-insulator (SOI) complementary metal oxide semiconductor (CMOS) wafer having a substrate layer, an insulation layer formed on the substrate layer and having a pixel region and a wall region surrounding the pixel region, a pixel structure formed on the pixel region of the insulation layer, a wall structure formed adjacent to the pixel structure and on the wall region of the insulation layer, a dielectric layer covering the pixel structure and the wall structure, a pixel mask formed within the dielectric layer and covering the pixel structure, and a wall mask formed within the dielectric layer and covering the wall structure. The method may include the steps of performing a vertical etching through a portion of the dielectric layer not covered by the pixel mask and the wall mask and through a portion of the insulation layer not covered by the pixel mask and the wall mask, so as to define a front pixel space for separating the pixel structure from the wall structure, removing the pixel mask and the wall mask, and performing an anisotropic silicon etching to form a well on the substrate layer and under the pixel structure, the well defining a back pixel space joining the front pixel space for thermally isolating the pixel structure from the substrate layer and the wall structure.

This summary is provided merely to introduce certain concepts and not to identify any key or essential features of the claimed subject matter.

BRIEF DESCRIPTION OF THE DRAWINGS

Other systems, methods, features, and advantages of the present invention will be or will become apparent to one with skill in the art upon examination of the following figures and detailed description. It is intended that all such additional systems, methods, features, and advantages be included within this description, be within the scope of the present invention, and be protected by the accompanying claims. Component parts shown in the drawings are not necessarily to scale, and may be exaggerated to better illustrate the important features of the present invention. In the drawings, like reference numerals designate like parts throughout the different views, wherein:

DETAILED DESCRIPTION

Apparatus, systems and methods that implement the embodiment of the various features of the present invention will now be described with reference to the drawings. The drawings and the associated descriptions are provided to illustrate some embodiments of the present invention and not to limit the scope of the present invention. Throughout the drawings, reference numbers are re-used to indicate correspondence between reference elements. In addition, the first digit of each reference number indicates the figure in which the element first appears.

Figure 1:
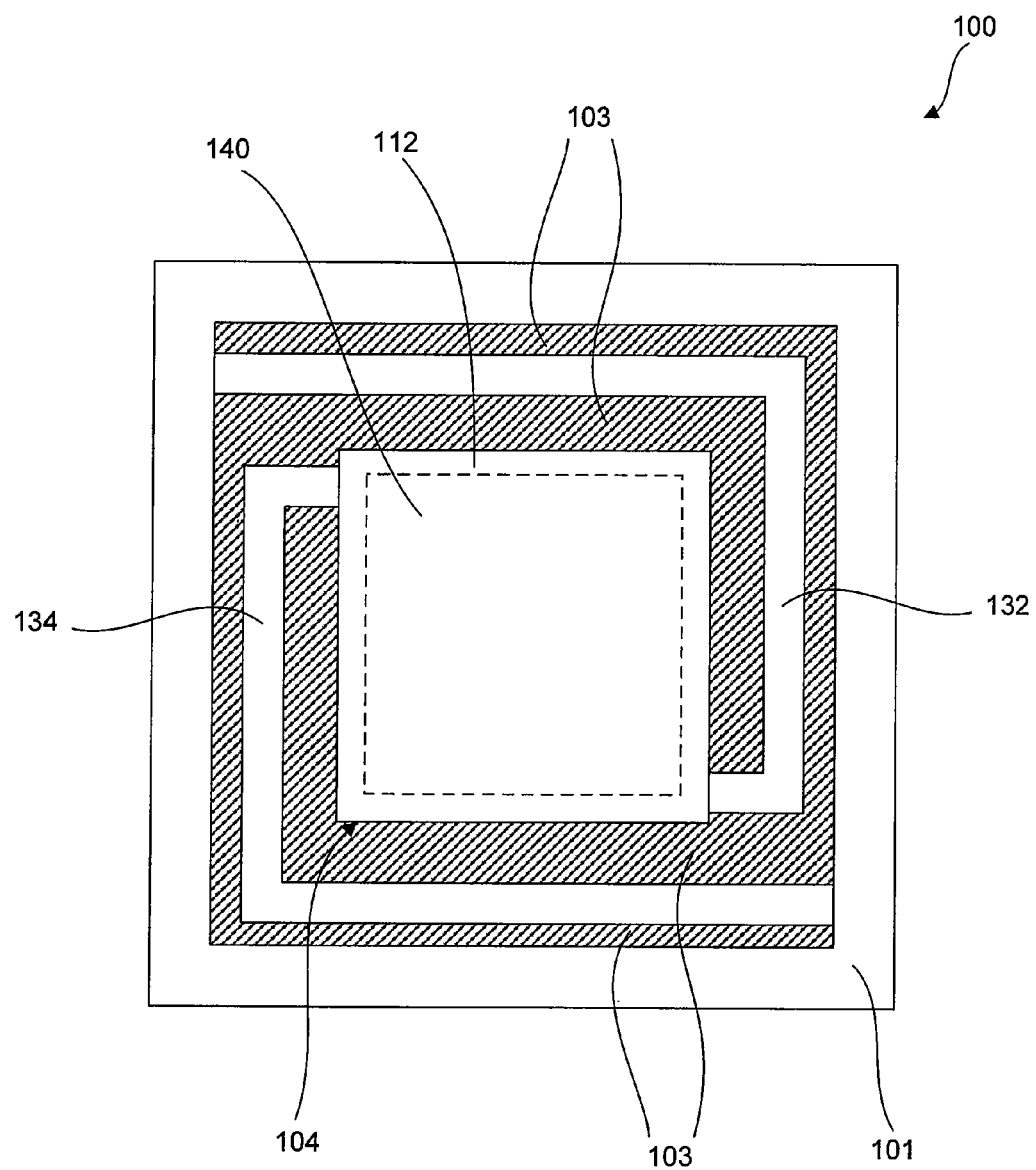
FIG. 1 shows a top view of an infrared detector pixel according to an embodiment of the present invention.

FIG. 1 shows a top view of an infrared detector pixel 100 according to an embodiment of the present invention. The infrared detector pixel 100 may be a single sensing unit, such that it may be duplicated and arranged to form a microbolometer focal plane array (FPA). The infrared detector pixel 100 may include a pixel wall 101, a pixel island 104, a first (right) support arm 132, and a second (left) support arm 134.

The pixel wall 101 may have a rectangular (e.g., a square) cross-sectional frame, which defines a thermal isolation space 103. The pixel island 104 may be positioned within the thermal isolation space 103 but without contacting the pixel wall 101. The first support arm 132 and the second support arm 134 may mechanically connect the pixel island 104 to the interior of the pixel wall 101. As such, the first support arm 132 and the second support arm 134 may suspend the pixel island 104 within the thermal isolation space 103.

The thermal isolation space 103 may provide thermal isolation between the pixel island 104 and the pixel wall 101, which may be shared by an adjacent infrared detect pixel (not shown). Accordingly, the thermal isolation space 103 may help prevent or slow down the transfer of heat between the pixel island 104 and the pixel wall 101. In one embodiment, the pixel wall 101 may form a through well with a first opening and a second opening. As such, the thermal isolation space 103 may be a through space that extends through the first opening and the second opening. In another embodiment, the pixel wall 101 may form a closed well with only one opening. As such, the thermal isolation space 103 may be a semi-through space that extends though only one opening of the closed well.

The pixel island 104 may include a heat absorption layer 112 and a diode group 140. The heat absorption layer 112 may receive the infrared ray (wave) and retain heat energy extracted from the infrared ray. In one embodiment, the heat absorption layer 112 may completely encapsulate the diode group 140. In another embodiment, the heat absorption layer 112 may substantially cover the diode group 140. In any event, the heat absorption layer 112 may have an internal temperature that indicates the characteristics of the received infrared ray. To enhance the infrared ray retention characteristics of the heat absorption layer 112, a layer of titanium, titanium nitride, and/or other similar material may be deposited on or formed within the heat absorption layer 112.

The diode group 140 may include one or more diodes, each of which may have a turn-on voltage that is controlled by the internal temperature of the heat absorption layer 112. In one embodiment, each diode may have a turn-on voltage that is different than the other diodes. In another embodiment, all the diodes may share similar turn-on voltages. By varying the turn-on voltages of the diodes, the infrared detector pixel 100 may provide an enhanced sensitivity to the incident infrared ray. The diodes may be arranged in various configurations. In one embodiment, for example, the diodes of the diode group 140 may be connected serially to form a diode chain. In another embodiment, for example, the diodes of the diode group 140 may be connected in parallel to form a diode net.

Figure 2A:
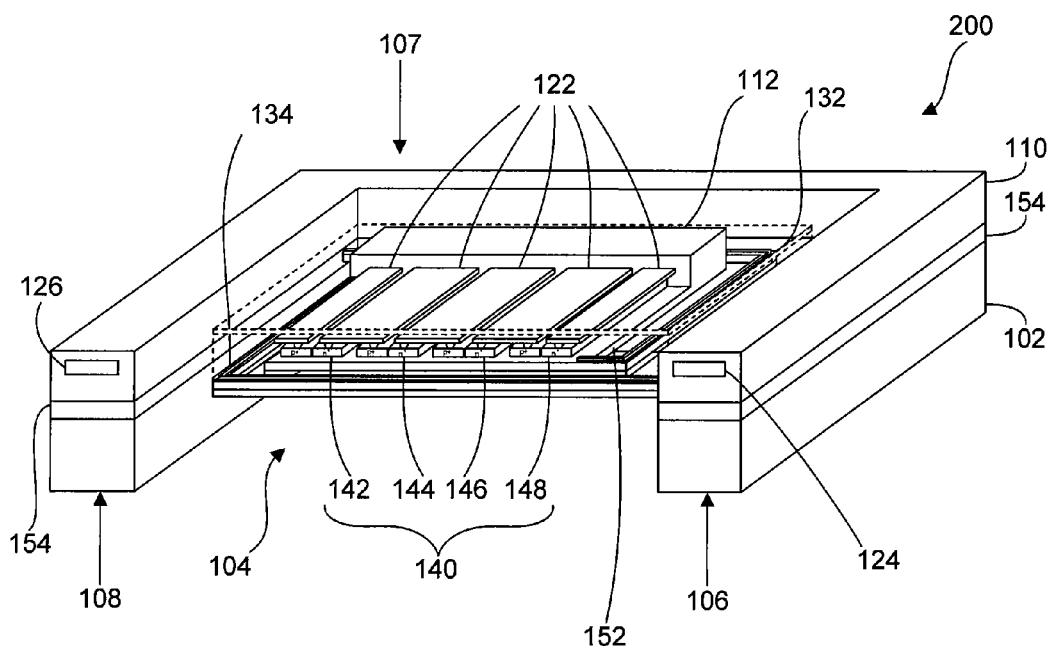
FIG. 2A shows a perspective view of an infrared detector pixel according to an embodiment of the present invention.

FIG. 2A shows a perspective view of an infrared detector pixel 200 according to an embodiment of the present invention. The infrared detector pixel 200 may share several interchangeable features with the infrared detector pixel 100. Additionally, the infrared detector pixel 200 may include functional and structural features that are different from those of the infrared detector pixel 100. The detector pixel 200 may include four pixel walls. However, for purpose of illustrating the internal structure of the infrared detector pixel 200, only the first (right) pixel wall 106, the second (back) pixel wall 107, and the third (left) pixel wall 108 are shown, while the fourth (front) pixel wall is omitted. The four pixel walls may join one another to form a through pixel well, which may define a first (top) opening, a second (bottom) opening, and a through space positioned between the first opening and the second opening.

Each of the pixel walls (e.g., the first, second, and third pixel walls 106, 107, and 108) may include a pixel wall oxide layer 110, a pixel wall insulating (buried oxide) layer 154, and a pixel wall substrate layer 102. Optionally, each of the pixel walls (e.g., the first, second, and third pixel walls 106, 107, and 108) may include one or more electrical wire for conducting electrical signal between a readout circuit (not shown) and the diode group 140.

In one embodiment, for example, the first pixel wall 106 may encapsulate a first readout wire 124 within the pixel wall oxide layer 110. In another embodiment, for example, the third pixel wall 108 may encapsulate a second readout wire 126 within the pixel wall oxide layer 110. The first readout wire 124 and the second readout wire 126 may each be used for carrying a digital signal, an analog signal, a biasing signal, an input signal, a column select signal, a row selection signal, and/or other signals for controlling the operation of the diode group 140. The first readout wire 124 and the second readout wire 126 may be part of a Metal-1 layer, a Metal-2 layer and/or a Metal-3 layer, each of which may include a conducting metal, such as copper, gold, and/or aluminum.

The infrared detector pixel 200 may include the pixel island 104, which may be suspended above the substrate layer 102 of the through pixel well, such that the pixel island 104 may be thermally isolated from the pixel walls (e.g., the first, second, and third pixel walls 106, 107, and 108). The pixel island 104 may include an island insulation (buried oxide) layer 152, the heat absorption layer 112, and the diode group 140. The island insulation layer 152 may be horizontally aligned with the pixel wall insulation layer 154. The heat absorption layer 112 may be horizontally aligned with the pixel wall oxide layer 110, and it may include multiple dielectric layers and anti-reflection layers.

In one embodiment, the heat absorption layer 112 may be made of the same material as the pixel wall oxide layer 110. In another embodiment, the heat absorption layer 112 may be made of a material that is different from that of the pixel wall oxide layer 110. In another embodiment, the heat absorption layer 112 may include a dielectric material, such as a nitride material and/or an oxide material. In yet another embodiment, the heat absorption layer 112 may include an anti-reflective material, such as a titanium material, a titanium nitride material, and/or other material with similar physical and chemical properties. Together, the heat absorption layer 112 and the island insulation layer 152 may substantially encapsulate the diode group 140.

The infrared detector pixel 100 may be deployed in a flip-chip configuration, in which the island insulation layer 152 may be oriented as the top side of the infrared detector pixel 100. Accordingly, the island insulation layer 152 may be used as a heat absorption layer. A titanium layer, a titanium nitride layer, and/or a layer with other material with similar physical and chemical properties may be deposited on the insulation layer 152 to enhance the infrared ray retention characteristic thereof.

The diode group 140 may include a plurality of diodes, such as a first diode 142, a second diode 144, a third diode 146, and a fourth diode 148. Each of the diodes (e.g., the first, second, third, and fourth diodes 142, 144, 146, and 148) may have a turn-on voltage that is adjustable by the internal temperature of the heat absorption layer 112. However, the turn-on voltage of each of the diodes (e.g., the first, second, third, and fourth diodes 142, 144, 146, and 148) may or may not be the same as one another. In one embodiment, for example, the diodes may share the same turn-on voltage. In another embodiment, for example, the diodes may have various progressive turn-on voltages. In yet another embodiment, for example, the diodes may have various linear turn-on voltages.

The first diode 142, the second diode 144, the third diode 146, and the fourth diode 148 may each have a p-n junction that is perpendicular to the island insulation layer 152 and to the substrate layer 102 of the pixel wall. The first diode 142, the second diode 144, the third diode 146, and the fourth diode 148 may be connected serially to form a diode chain. In one embodiment, the pixel island 104 may include a plurality of inter-diode metallic plates 122, each of which may connect the opposite junctions of a pair of diodes.

In addition to providing electrical connection among the diode group 140, the inter-diode metallic plates 122 may function as a series of internal reflecting surface for the heat absorption layer 112. Because the turn-on voltages of the diodes (e.g., the first diode 142, the second diode 144, the third diode 146, and/or the fourth diode 148) are controlled by temperature, but not directly by the received infrared ray, it may be desirable to use the inter-diode metallic plates 122 to reflect the unabsorbed infrared ray back to the heat absorption layer 112 for further absorption. In return, the heat absorption layer 112 may further convert the reflected infrared ray to heat. In one embodiment, the inter-diode metallic plates 122 may be extended to cover the entire horizontal cross sectional surface of the heat absorption layer 112 in order to maximum the reflection functionality thereof.

The electrical signal carried by the inter-diode metallic plates 122 may be communicated to a readout circuit via the first support arm 132 and/or the second support arm 134. In one embodiment, for example, the first support arm 132 may provide electrical and/or mechanical connections between the pixel island 104 and the third pixel wall 108. In another embodiment, for example, the second support arm 134 may provide electrical and/or mechanical connections between the pixel island 104 and the first pixel wall 106.

Figure 2B:
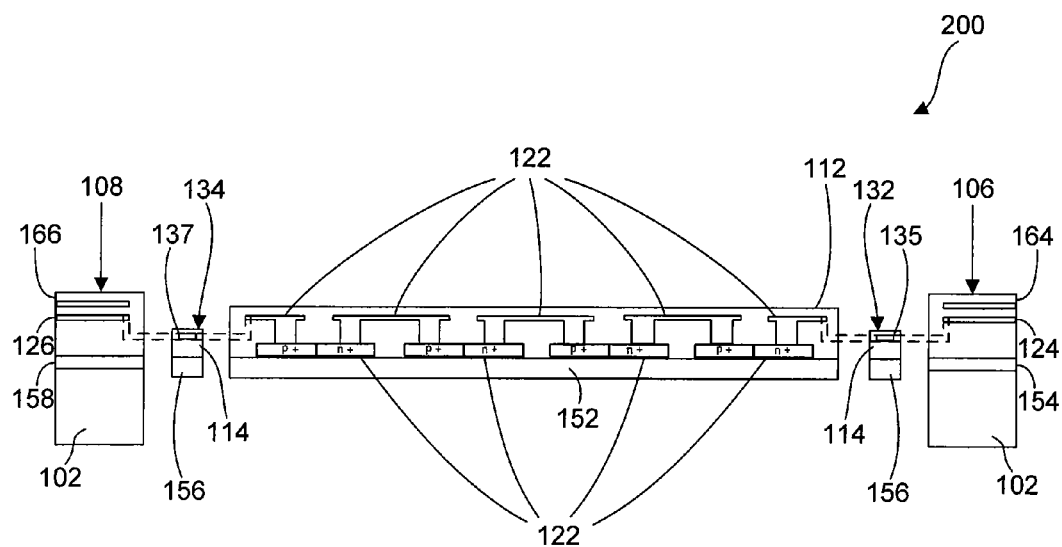
FIG. 2B shows a cross-sectional view of the infrared detector pixel according to an embodiment of the present invention.

As shown in FIG. 2B, each of the first support arm 132 and the second support arm 134 may include similar layers as the pixel walls (e.g., the first, second, and/or third pixel walls 106, 107, and/or 108) and the pixel island 104. In one instance, the first support arm 132 and the second support arm 134 may each include a support arm insulation layer 156, which may be horizontally aligned with the island insulation layer 152 and the pixel wall insulation layer 154. In another instance, the first support arm 132 and the second support arm 134 may each include a support arm oxide layer 114, which may be horizontally aligned with the pixel wall oxide layer 110 and the heat absorption layer 112. The support arm oxide layer 114 may provide mechanical support for the pixel island 104, and it may prevent the transfer of heat between the pixel island 104 and the pixel walls (e.g., the first pixel wall 106 and/or the third pixel wall 108).

The first support arm 132 may include a first polysilicon wire 135, which may be encapsulated by the support arm oxide layer 114. The first polysilicon wire 135 may establish an electrical coupling between the inter-diode metallic plates 122 and the first readout wire 124 of the first pixel wall 106. The second support arm 134 may include a second polysilicon wire 137, which may be encapsulated by the support arm oxide layer 114. The second polysilicon wire 137 may establish an electrical coupling between the inter-diode metallic plates 122 and the second readout wire 126 of the first pixel wall 106. While other conducting material may be used for forming the conducting wires in the first support arm 132 and/or the second support arm 134, polysilicon may be preferred because of its relatively low thermal conductance.

In addition to the first readout wire 124, the first pixel wall 106 may include a third readout wire 164. Generally, the third readout wire 164 may conduct similar signals as the first readout wire 124. The third readout wire 164 may be a part of a higher metal layer than the first readout wire 124. As such, the third readout wire 164 may be used for global routing while the first readout wire 124 may be used for local and/or inter-pixel routings. Similarly, in addition to the second readout wire 126, the third pixel wall 108 may include a fourth readout wire 166. Generally, the fourth readout wire 166 may conduct similar signals as the second readout wire 126. The fourth readout wire 166 may be a part of a higher metal layer than the second readout wire 126. As such, the fourth readout wire 166 may be used for global routing while the second readout wire 126 may be used for local and/or inter-pixel routings.

The discussion now turns to various methods for manufacturing uncooled infrared detectors (e.g., the infrared detector pixels 100 and 200) by using foundry-defined silicon-on-insulator (SOI) complementary metal oxide semiconductor (CMOS) wafers. A SOI-CMOS wafer may be fabricated by using a SOI-CMOS process. Generally, the SOI-CMOS process may be customer-specific or generic.

The customer-specific SOI-CMOS process may be defined by individual customers based on their particular design goals. The customer-specific SOI-CMOS process of one customer may or may not fulfill the design goals of another customer. As such, the customer-specific SOI-CMOS process typically involves specific design rules, process sequence, and/or process parameters. These specific requirements may increase the time and cost for fabricating the SOI-CMOS wafers. Moreover, because of its specific nature, the SOI-CMOS wafers fabricated according to the customer-specific SOI-CMOS process are unlikely to be adopted by other applications. Therefore, the production cost of customer-specific SOI-CMOS wafers is generally high.

On the other hand, the generic SOI-CMOS process (a.k.a. standard SOI-CMOS process) may be defined and offered by one or more foundries (e.g., fabrication companies that fabricate SOI-CMOS wafers). The generic SOI-CMOS process may fulfill the design requirements of the many customers. As such, the generic SOI-CMOS process typically involves standard design rules, process sequence, and/or process parameters, which may reduce the time and cost for fabricating the foundry-defined SOI-CMOS wafers. Moreover, because of its generic nature, the SOI-CMOS wafers fabricated according to the generic SOI-CMOS process are likely to be adopted by other applications. Due to the economies of scale, the production cost of foundry-defined SOI-CMOS wafers (a.k.a. standard SOI-CMOS wafers) is much lower than that of the customer-specific SOI-CMOS wafers.

The methods disclosed herein may involve a few process steps for modifying the foundry-defined SOI-CMOS wafers. The modification may allow the SOI-CMOS wafers to incorporate the functional and structural features of the uncooled infrared detector (e.g., the uncooled infrared detector pixels 100 and 200). These process steps may be cost efficient and easy to perform because they have a relatively high tolerance margin (a.k.a. non-critical) when compared to conventional lithography and deposition steps. Advantageously, the methods disclosed herein may allow the cost and yield of the uncooled infrared detectors to be improved tremendously.

Generally, a foundry-defined SOI-CMOS wafer may include a substrate layer, an insulation layer, and a dielectric layer. The substrate layer may provide structural support for the insulation layer and the dielectric layer. The insulation layer may be formed on the substrate layer, and it may define at least one pixel region and at least one wall region. The wall region may, partially or completely, surround the pixel region, but without contacting the pixel region. As such, a space may be defined between the pixel region and the wall region.

Depending on the design goal, the pixel region and the wall region may have various shapes. In one embodiment, for example, the pixel region may have a square shape and the wall region may have a square frame shape. In another embodiment, for example, the pixel region may have a circular shape and the wall region may have a circumferential shape. In yet another embodiment, for example, the pixel region may have a hexagonal shape and the wall region may have a hexagonal frame shape.

The dielectric layer may be formed on top of the insulation layer, and it may cover, and be used for composing, one or more pixel structures, wall structures, biasing circuits, and/or readout circuits. The pixel structure may include a diode group (e.g., the diode group 140). The diode group may include similar functional and structural features as the diode group 140 as previously discussed. The diode group may include one or more doped silicon material, and it may be formed on the insulation layer (hence the term "SOI").

The dielectric layer may include multiple layers, each of which may include an oxide material, a nitride material, and/or other dielectric materials. The dielectric layer may be embedded with multiple mask layers, each of which may be designated to protect a particular structure (e.g., the pixel structure, the wall structure, the biasing circuit, or the readout circuit) from one or more post-CMOS front etching processes. The mask layers may be made of a metallic material and/or a polysilicon material. In one embodiment, for example, the mask layers may be formed as part of the polysilicon layer and/or the metal layers (e.g., the Metal-1 layer, Metal-2 layer, and/or Metal-3 layer). Similarly, the insulation layer may be designated to protect all the structures from one or more post-CMOS back etching processes.

As discussed herein, but without prescribing any limitation hereto, the front side of the SOI-CMOS wafer may be understood as the exposed surface of the dielectric layer, while the back side of the SOI-CMOS wafer may be understood as the exposed surface of the substrate layer. Moreover, the horizontal direction may be understood as a direction that is parallel to the substrate layer, while the vertical direction may be understood as a direction that is perpendicular to the substrate layer. The post-CMOS back etching may be used for removing a portion of the substrate layer to define a back pixel space that is terminated by the insulation layer. The post-CMOS front etching may be used for removing some portions of the dielectric layer and the insulation layer. Typically, the removed portions are the exposed portions, which might not be protected by any of the mask layers. After the post-CMOS front etching, a front pixel space may be defined between the pixel structure and the wall structure.

Accordingly, the pixel structure may become a suspended pixel island, which may be thermally isolated from the wall structure. After establishing the thermal isolation for the pixel island, a mask layer removal step may be performed to remove all the mask layers. Both the front and back etchings may be classified as vertical etchings because they progress along the vertical direction of the SOI-CMOS wafer. Moreover, the back etchings may involve horizontal etching during an anisotropic silicon etching and/or a sacrificial layer etching, which may be discussed in greater detail in the later sections.

The front etching may include using a dry etchant that may etch away the dielectric material but not the mask material. As such, the front etching may be referred as a dry dielectric etching. The front etching may include, but not limited to, a reactive ion etching (RIE), a reactive ion-beam etching (RIBE), and/or a chemically assisted ion-beam etching (CAIBE).

The back etching may include using an etchant that may etch away the silicon material but not the dielectric material or the insulation material (e.g., buried oxide). Depending on the types of pixel well to be formed, the back etching may include a deep dry silicon etching and/or an anisotropic silicon etching. For example, a deep dry silicon etching may be used to form a through pixel well, while an anisotropic silicon etching may be used to form a closed pixel well.

The deep dry silicon etching may employ a dry etchant to completely remove a vertical portion of the substrate layer to form a through pixel well. As such, the pixel region of the insulation layer may be completely exposed to a back space after the deep dry etching. The deep dry silicon etching may include, but not limited to, a deep reactive ion etching (DRIE) and/or other types of vertical silicon etchings.

The anisotropic silicon etching may employ a chemical solution to partially remove a horizontal portion of the substrate layer that is located directly under, and adjacent to, the pixel region of the insulation layer. The chemical solution may include various compounds, such as ethylenediamine pyrocatechol (EDP), tetramethylammonium hydroxide (TMAH), and/or potassium hydroxide (KOH). After the horizontal portion of the substrate layer is removed, a closed well with a partially enclosed cavity may be formed. The partially enclosed cavity may provide the desired thermal isolation for the pixel island. Unlike the through well structure, the closed well structure might not define a through space. That is, the vertical portion of the substrate layer positioned below the pixel region might not be completely removed.

During the anisotropic silicon etching, the insulation layer and the dielectric layer may cover the diode group, and thereby protect the diode group from being etched by the etchant. Because of the protection provided by the insulation layer and the dielectric layer, the anisotropic silicon etching may achieve the desired result (e.g., providing thermal isolation for the pixel island) even without using any electrochemical etch stop, which may be used in conventional anisotropic silicon etching for preventing the etching of the exposed diode group. The elimination of the electrochemical etch stop may allow the anisotropic silicon etching to be performed uniformly across an array of pixels without the burden of applying and fine-tuning voltages between multiple pixel structures and the substrate layer. In such a manner, the anisotropic silicon etching may be performed efficiently.

Although the aforementioned methods and process steps may be used for manufacturing uncooled infrared detector from foundry-defined SOI-CMOS wafers, these methods and process steps may be adaptively applied to customer-specific SOI-CMOS wafers as well. While such an adaptive application might not incur the benefits of the foundry-defined SOI-CMOS wafers, it may nevertheless obtain the advantages of the aforementioned methods and process steps.

The following discussion provides several specific embodiments for implementing the aforementioned methods and/or process steps. These specific embodiments, as shown in FIGS. 3A-3H, 4A-4F, 5A-5B, 6A-6F, and 7A and 7B, may introduce new components and/or terminologies that are not discussed or described in the previous sections. It is understood that these newly introduced components and/or terminologies may be construed in a manner that is consistent with, but without limiting, the scope and spirit of the aforementioned methods and process.

Figure 3A:
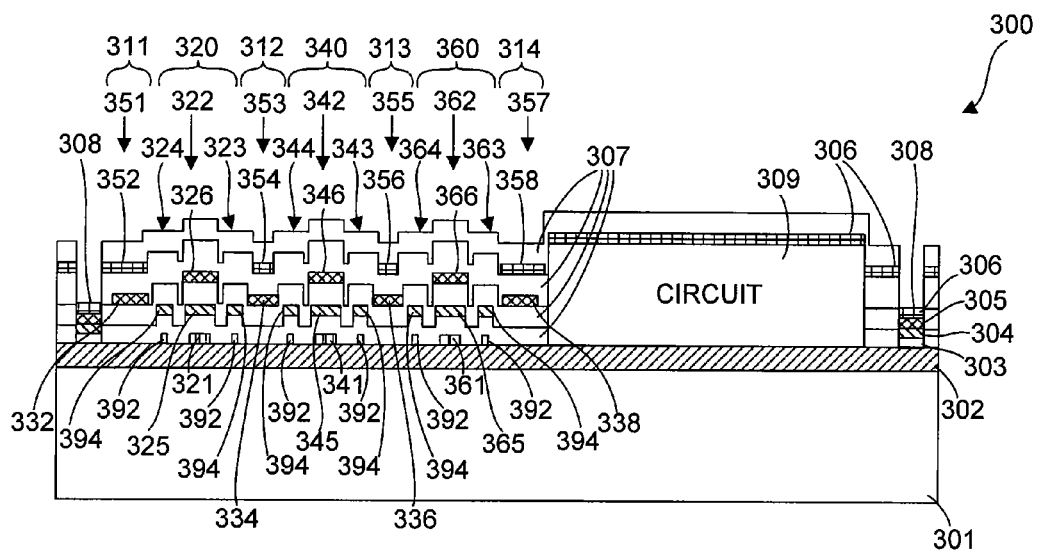
FIGS. 3A-3H show the cross-sectional views of a foundry-defined silicon-on-insulator (SOI) complementary metal oxide semiconductor (CMOS) wafer being processed to form a through well microbolometer according to an embodiment of the present invention.

FIGS. 3A-3H show the cross-sectional views of a foundry-defined SOI-CMOS wafer (or the "wafer") 300 being processed to form a through well microbolometer 380 according to an embodiment of the present invention. Referring to FIG. 3A, the wafer 300 may include a substrate layer (silicon handler wafer) 301, an insulation layer 302, and several oxide layers 307.

The substrate layer 301 may be made of silicon and/or other semiconducting material, and it may provide a foundation for the insulation layer 302 and the oxide layers 307. The insulation layer 302 may be made of an insulating material, such as silicon dioxide and/or silicon nitride. When the insulation layer 302 is made of an oxide material, the insulation layer 302 may be a buried oxide (BOX) layer. The oxide layers 307 may be formed on top of the insulation layer 302 for covering various structures (e.g., pixel structures, wall structures, and/or circuit structures) and filling in the space defined among the various structures. Moreover, the oxide layers 307 may be used for separating various conducting and/or semiconducting layers within each structure. Generally, the exposed side of the oxide layers 307 may be referred to as the front side and/or the top side, and the exposed side of the substrate layer 301 may be referred to as the back side and/or the bottom side. Although the oxide layers 307 are generally described in FIG. 3A, one or more of the oxide layers 307 may be replaced with layers that are made of other dielectric materials (e.g., a nitride material) in various embodiments.

The insulation layer 302 may define various regions for supporting various structures (e.g., pixel structures, wall structures, and/or circuit structures) thereon. In one embodiment, for example, the insulation layer 302 may define a first wall region 311, a second wall region 312, a third wall region 313, and a fourth wall region 314. A wall structure may be developed on top of one or more of the wall regions (e.g., the first wall region 311, the second wall region 312, the third wall region 313, and/or the fourth wall region 314). In another embodiment, for example, the insulation layer 302 may define a first pixel region 320, a second pixel region 340, and a third pixel region 360. Each of the pixel regions 320, 340, and 360 may be surrounded, partially or completely, by one or more wall regions (e.g., the first wall region 311, the second wall region 312, the third wall region 313, and/or the fourth wall region 314).

A first wall structure 351 may be formed on the first wall region 311. The first wall structure 351 may include a first inter-pixel metal layer 332 and a first inter-pixel mask layer 352. The first inter-pixel metal layer 332 may be used for conducting electrical signals to and from the adjacent pixel structure. The first inter-pixel mask layer 352 may cover and protect the first inter-pixel metal layer 332 and the interposing oxide layers 307. The first inter-pixel mask layer 352 may be made of a material that is resistive to the dry oxide etching. In one embodiment, for example, the first inter-pixel mask layer 352 may be made of aluminum, gold, copper, titanium, and/or other metallic material. Generally, the first inter-pixel mask layer 352 may position farther away from the insulation layer 302 than the first inter-pixel metal layer 332.

A second wall structure 353 may be formed on the second wall region 312. The second wall structure 353 may include a second inter-pixel metal layer 334 and a second inter-pixel mask layer 354. The second inter-pixel metal layer 334 may be used for conducting electrical signals to and from the adjacent pixel structure. The second inter-pixel mask layer 354 may cover and protect the second inter-pixel metal layer 334 and the interposing oxide layers 307. The second inter-pixel mask layer 354 may be made of a material that is resistive to the dry oxide etching. In one embodiment, for example, the second inter-pixel mask layer 354 may be made of aluminum, gold, copper, titanium, and/or other metallic material. Generally, the second inter-pixel mask layer 354 may position farther away from the insulation layer 302 than the second inter-pixel metal layer 334.

A third wall structure 355 may be formed on the third wall region 313. The third wall structure 355 may include a third inter-pixel metal layer 336 and a third inter-pixel mask layer 356. The third inter-pixel metal layer 336 may be used for conducting electrical signals to and from the adjacent pixel structure. The third inter-pixel mask layer 356 may cover and protect the third inter-pixel metal layer 336 and the interposing oxide layers 307. The third inter-pixel mask layer 356 may be made of a material that is resistive to the dry oxide etching. In one embodiment, for example, the third inter-pixel mask layer 356 may be made of aluminum, gold, copper, titanium, and/or other metallic material. Generally, the third inter-pixel mask layer 356 may position farther away from the insulation layer 302 than the third inter-pixel metal layer 336.

A fourth wall structure 357 may be formed on the fourth wall region 314. The fourth wall structure 357 may include a fourth inter-pixel metal layer 338 and a fourth inter-pixel mask layer 358. The fourth inter-pixel metal layer 338 may be used for conducting electrical signals to and from the adjacent pixel structure. The fourth inter-pixel mask layer 358 may cover and protect the fourth inter-pixel metal layer 338 and the interposing oxide layers 307. The fourth inter-pixel mask layer 358 may be made of a material that is resistive to the dry oxide etching. In one embodiment, for example, the fourth inter-pixel mask layer 358 may be made of aluminum, gold, copper, titanium, and/or other metallic material. Generally, the fourth inter-pixel mask layer 358 may position farther away from the insulation layer 302 than the fourth inter-pixel metal layer 338.

A first pixel structure 322 may be formed on the first pixel region 320, such that it may be surrounded by the first and second wall structures 351 and 353. The first pixel structure 322 may include a first diode group 321, a first intra-pixel metal layer 325, and a first intra-pixel mask layer 326. The first diode group 321 may have similar functional and structural features as the diode group 140. The first intra-pixel metal layer 325 may have similar functional and structural features as the inter-diode metallic plates 122. The first intra-pixel mask layer 326 may cover and protect the first diode group 321, the first intra pixel metal layer 325, and the oxide layers 307 positioned therebetween. The first intra-pixel mask layer 326 may be made of a material that is resistive to the dry oxide etching. In one embodiment, for example, the first intra-pixel mask layer 326 may be made of aluminum, gold, copper, titanium, and/or other metallic material. Generally, the first intra-pixel mask layer 326 may position farther away from the insulation layer 302 than the first intra-pixel metal layer 325.

A second pixel structure 342 may be formed on the second pixel region 340, such that it may be surrounded by the second and third wall structures 353 and 355. The second pixel structure 342 may include a second diode group 341, a second intra-pixel metal layer 345, and a second intra-pixel mask layer 346. The second diode group 341 may have similar functional and structural features as the diode group 140. The second intra-pixel metal layer 345 may have similar functional and structural features as the inter-diode metallic plates 122. The second intra-pixel mask layer 346 may cover and protect the second diode group 341, the second intra-pixel metal layer 345, and the oxide layers 307 positioned therebetween. The second intra-pixel mask layer 346 may be made of a material that is resistive to the dry oxide etching. In one embodiment, for example, the second intra-pixel mask layer 346 may be made of aluminum, gold, copper, titanium, and/or other metallic material. Generally, the second intra-pixel mask layer 346 may position farther away from the insulation layer 302 than the second intra-pixel metal layer 345.

A third pixel structure 362 may be formed on the third pixel region 360, such that it may be surrounded by the third and fourth wall structures 355 and 357. The third pixel structure 362 may include a third diode group 361, a third intra-pixel metal layer 365, and a third intra-pixel mask layer 366. The third diode group 361 may have similar functional and structural features as the diode group 140. The third intra-pixel metal layer 365 may have similar functional and structural features as the inter-diode metallic plates 122. The third intra-pixel mask layer 366 may cover and protect the third diode group 361, the third intra-pixel metal layer 365, and the oxide layers 307 positioned therebetween. The third intra-pixel mask layer 366 may be made of a material that is resistive to the dry oxide etching. In one embodiment, for example, the third intra-pixel mask layer 366 may be made of aluminum, gold, copper, titanium, and/or other metallic material. Generally, the third intra-pixel mask layer 366 may position farther away from the insulation layer 302 than the third intra-pixel metal layer 365.

A pair of support arm structures may be formed adjacent to each of the pixel structures (e.g., the first, second, and third pixel structures 322, 342, and 362). Similar to the first and second support arms 132 and 134 as shown in FIGS. 2A and 2B, the pair of support arm structures may provide mechanical and electrical connections between the pixel structure and the adjacent wall structures. Each of the support arm structure may include a polysilicon wire 392 and a support arm mask layer 394. The polysilicon wire 392 may be used for establishing an electrical connection between the pixel structure and one of the adjacent wall structures. The support arm mask layer 394 may cover and protect the polysilicon wire 392.

Within the first pixel region 320, the first right support arm 323 may connect the first pixel structure 322 to the second wall structure 353, while the first left support arm 324 may connect the first pixel structure 322 to the first wall structure 351. Within the second pixel region 340, the second right support arm 343 may connect the second pixel structure 342 to the third wall structure 355, while the second left support arm 344 may connect the second pixel structure 342 to the second wall structure 353. Within the third pixel region 360, the third right support arm 363 may connect the third pixel structure 362 to the fourth wall structure 357, while the third left support arm 364 may connect the third pixel structure 362 to the third wall structure 355.

The foundry-defined SOI-CMOS wafer (or the "wafer") 300 may include a readout circuit 309 for interacting with one or more diode groups (e.g., the first diode group 321, the second diode group 341, and the third diode group 361). The readout circuit 309 may be configured to select one or more diode groups, to bias the selected diode groups, to receive sensing signals from the selected diode groups, and/or to amplify the received sensing signals. In order to communicate with the diode groups, the readout circuit 309 may be routed with various conductive layers, such as a global polysilicon layer 303, a global Metal-1 layer 304, a global Metal-2 layer 305, and a global Metal-3 layer 306. Generally, the global Metal-3 layer 306 may be used as a mask layer for protecting other parts of the wafer 300. For example, the Metal-3 layer 306 may be used for protecting the readout circuit 309 during a dry oxide etching. Moreover, the Metal-3 layer 306 may be used for forming any of the other mask layers, such as the inter-pixel mask layers, the intra-pixel mask layers, and/or the support arm mask layers. In addition to the Metal-1 layer 304, the Metal-2 layer 305, and the Metal-3 layer 306, the wafer 300 may include additional metal layers, each of which may be used as a mask.

Figure 3B:
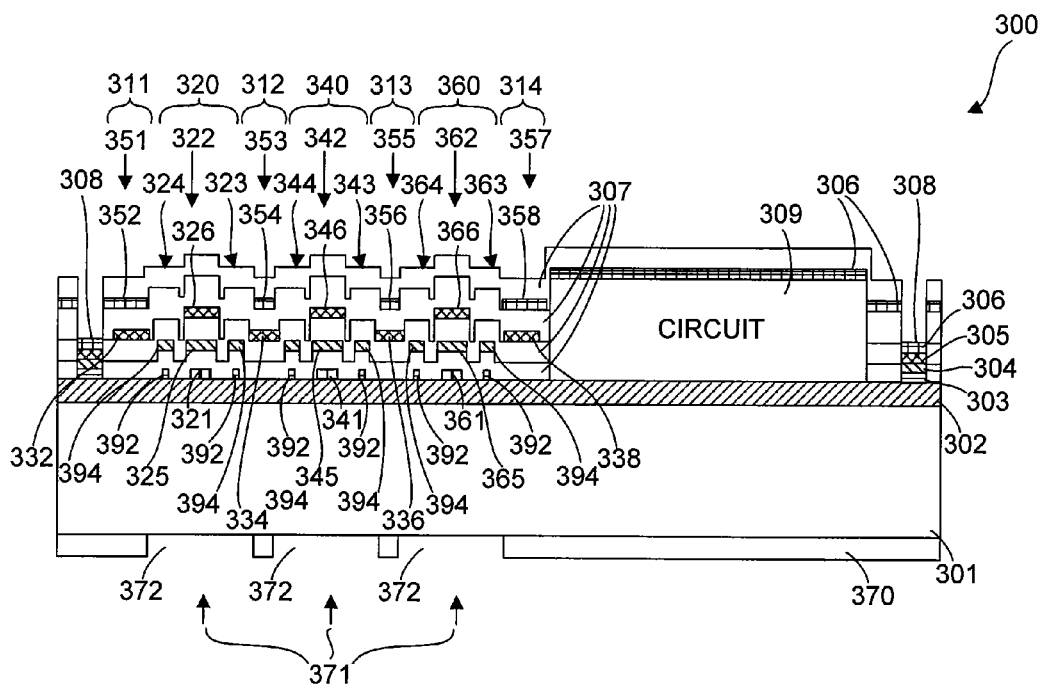

Referring to FIG. 3B, a back side mask layer 370 may be deposited and/or coated on the back side of the wafer 300. The back side mask layer 370 may be made of a material that is resistive to silicon etching. In one embodiment, for example, the back side mask layer 370 may be made of a nitride. In another embodiment, for example, the back side mask layer 370 may be made of an oxide. In another embodiment, for example, the back side mask layer 370 may be made of a photoresist material. In yet another embodiment, for example, the back side mask layer 370 may be made of a metallic material.

After the deposition of the back side mask layer 370, a plurality of back side apertures 372 may be defined thereon. If the back side mask layer 370 is made of a photoresist material, a back side lithography process 371 may be performed. Alternatively, if the back side mask layer 370 is made of a metallic material, an oxide material, and/or a nitride material, a selective etching process (not shown) may be performed. Each of the back side apertures 372 may vertically align or overlap with one of the pixel regions (e.g., the first pixel region 320, the second pixel region 340, and the third pixel region 360). As such, each of the back side apertures 372 may prepare a vertical portion of the substrate layer 301 for the upcoming silicon etching process. On the other hand, the remaining back side mask layer 370 may cover various portions of the substrate layer 301. These portions may vertically align or overlap with the wall regions and the readout circuit 309, and they may be preserved from being etching during the upcoming silicon etching process.

Figure 3C:
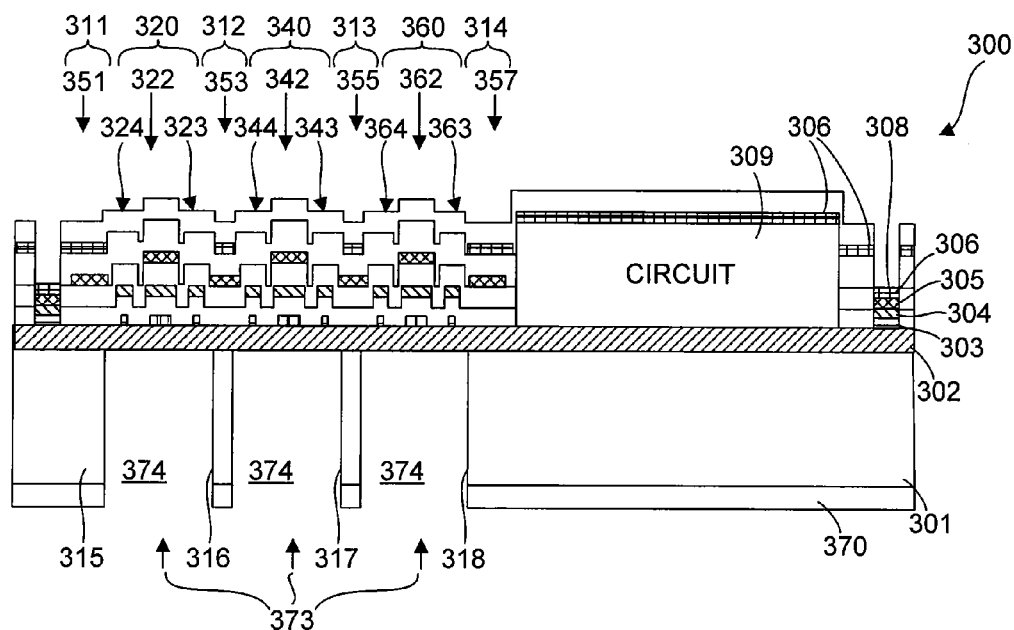

Referring to FIG. 3C, a back side deep dry silicon etching (a first vertical etching) 373 may be performed after the back side apertures 372 are properly defined. The back side deep dry silicon etching 373 may etch away the uncovered portions (i.e., the portions aligned with the back side apertures 372) of the substrate layer 301. The back side deep dry silicon etching 373 may be terminated or stopped at the insulation layer 302.

As a result of the deep dry silicon etching 373, a plurality of back pixel spaces 374 may be defined within and throughout the substrate layer 301. Each of the back pixel spaces 374 may align with one of the pixel regions (e.g., the first pixel region 320, the second pixel region 340, and the third pixel region 360), thereby allowing air to circulate to the pixel regions of the insulation layer 302. The deep dry silicon etching 373 may include a deep reactive ion etching (DRIE) or other types of vertical silicon etchings.

Each of the back pixel spaces 374 may be surrounded by a plurality of wall strips, which may extend from the wall regions of the insulation layer 302. For example, a first wall strip 315 may extend from the first wall region 311; a second wall strip 316 may extend from the second wall region 312; a third wall strip 317 may extend from the third wall region 313; and a fourth wall strip 318 may extend from the fourth wall region 314. Each of the wall strips may have an aspect ratio, which may be defined as a ratio of the length of the wall strip to the width of the wall strip. To improve the thermal isolation feature and the spatial efficiency of the uncooled infrared detector, it may be desirable to have relatively narrow wall strips. Because the thickness of the substrate layer may be fixed, the height of each of the wall strips may be fixed as well. Therefore, it may be desirable to have wall strips with high aspect ratio. In one embodiment, for example, each of the wall strips may have an aspect ratio of about 10.

Figure 3D:
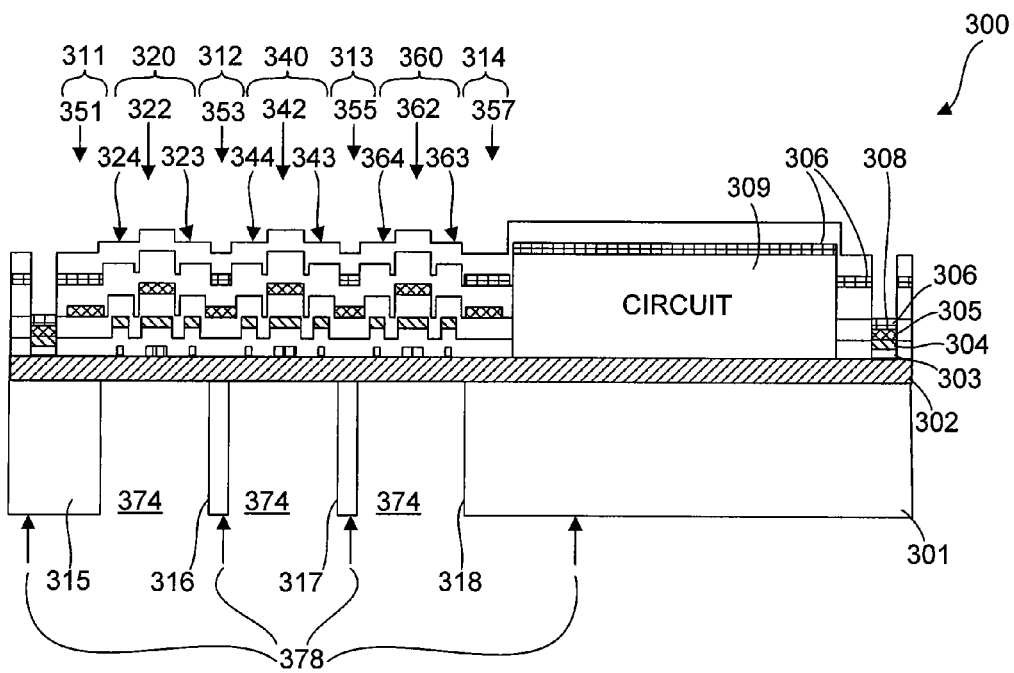
Figure 3E:
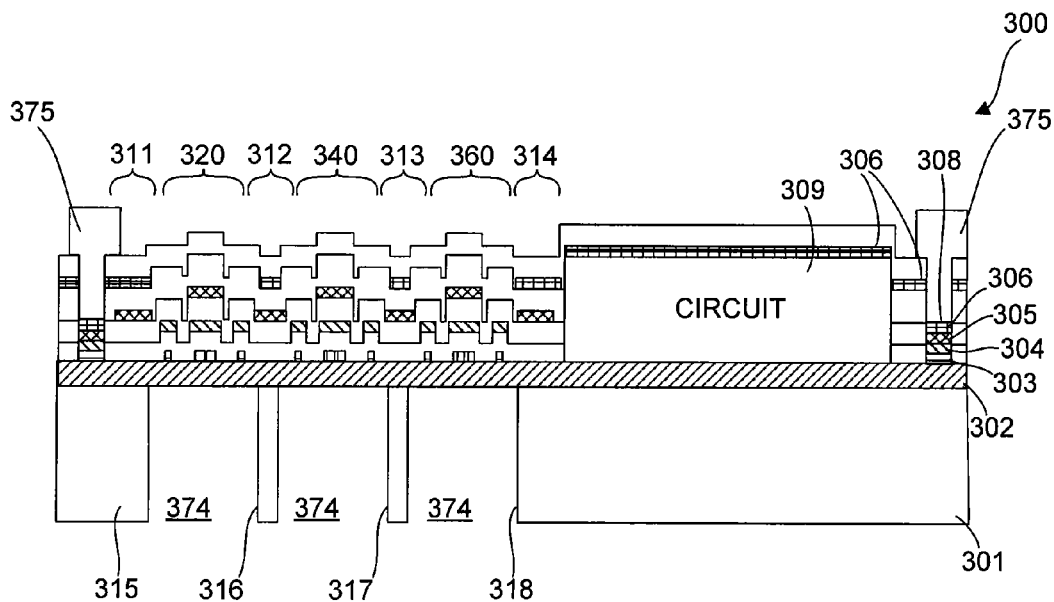

Referring to FIG. 3D, a back side mask releasing step 378 may be performed after the plurality of back pixel spaces 374 are properly defined. Referring to FIG. 3E, a front side photoresist mask 375 may be deposited to cover the input-output (I/O) pads 308 of the wafer 300. The photoresist mask 375 may be resistive to wet metal etching, such that it may be used for protecting the global metal layers of the I/O pads 308. In one embodiment, the photoresist mask 375 may be deposited before the performance of the front side etching. In another embodiment, the photoresist mask 375 may be deposited before the performance of the wet metal etching.

Figure 3F:
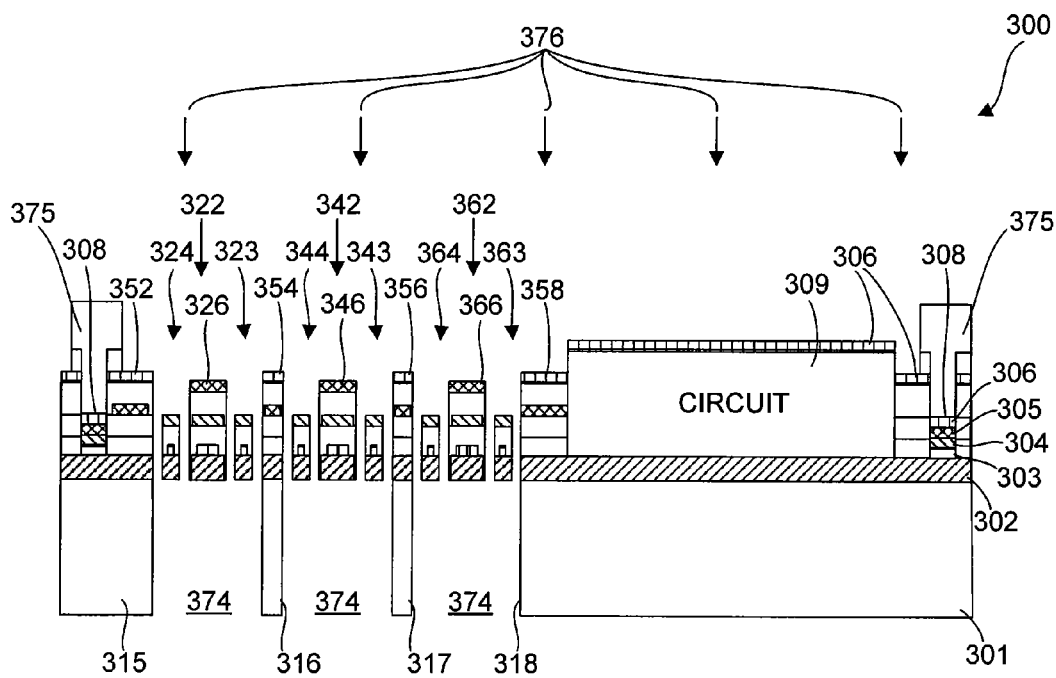

Referring to FIG. 3F, a front side dry oxide etching (a second vertical etching) 376 may be performed to remove the unprotected portions of the oxide layers 307 and the unprotected portions of the insulation layer 302. As disclosed herein, the unprotected portions may be the portions that are not covered by any mask layer. For example, the portions positioned between various structures may be the unprotected portions. The purpose of the front side dry oxide etching 376 may be to define a plurality of front pixel spaces between the pixel structures (e.g., the first, second, and third pixel structures 322, 342, and 362) and the wall structures (e.g., the first, second, third, and fourth wall structures 351, 353, 355, and 357). The front side dry oxide etching 376 may be generally implemented by a front side dry dielectric etching (not shown) when one or more of the oxide layers 307 are replaced with layers that are made of other dielectric materials (e.g., a nitride material). The front side dry oxide etching 376 may include a reactive ion etching (RIE), a reactive ion-beam etching (RIBE), and/or a chemically assisted ion-beam etching (CAIBE).

The various mask layers (e.g., the pixel masks, the wall masks, the support arm masks, and the circuit mask) may be preformed by using one or more metal layers during the foundry defined SOI-CMOS process. As such, no additional post-CMOS lithographic process may be required to define these mask layers. Therefore, the front side oxide etching process may be performed at a relatively low cost and within a relatively short period of time.

As a result of the front side dry oxide etching 376, the various pixel structures may become various suspended pixel islands, each of which may be held or suspended by the adjacent walls via a pair of support arms. In one embodiment, for example, the first pixel island 322 may be held or suspended by the first wall 351 and the second wall 353 via the first left support arm 324 and the first right support arm 323 respectively. In another embodiment, for example, the second pixel island 342 may be held or suspended by the second wall 353 and the third wall 355 via the second left support arm 344 and the second right support arm 343 respectively. In yet another embodiment, for example, the third pixel island 362 may be held or suspended by the third wall 355 and the fourth wall 357 via the third left support arm 364 and the third right support arm 363 respectively.

Figure 3G:
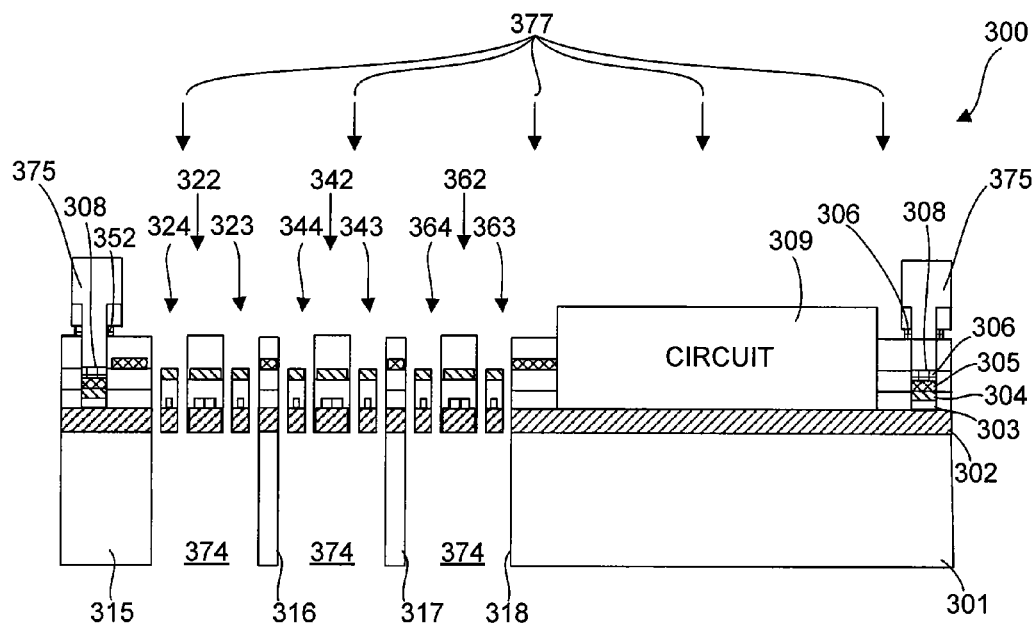
Figure 3H:
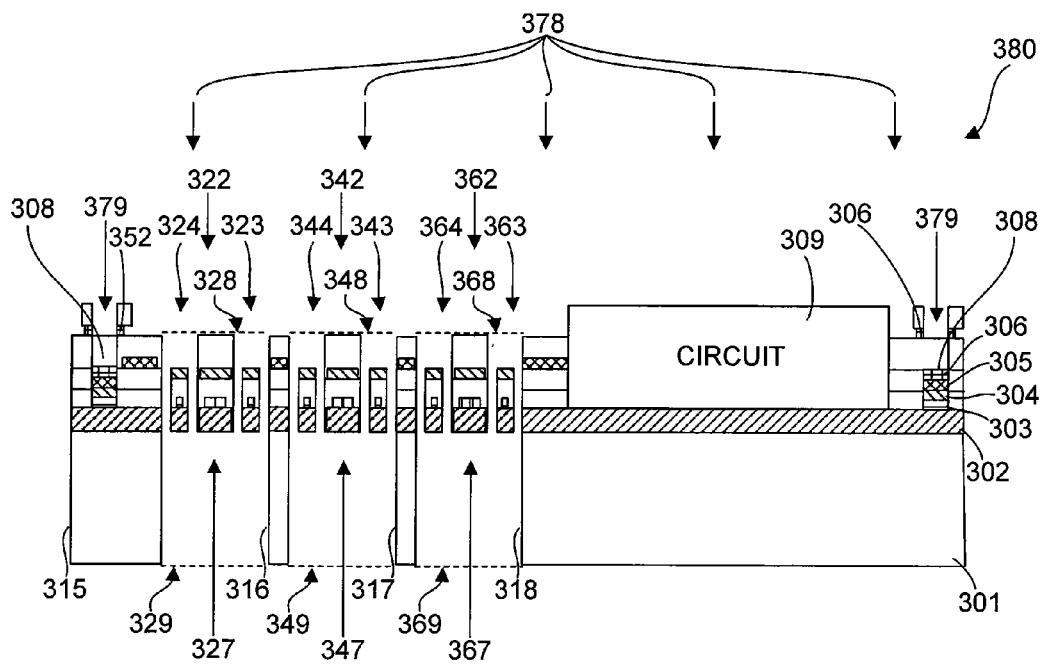

Referring to FIG. 3G, a metal mask etching (a third etching) 377 may be performed to remove the various mask layers (e.g., the pixel masks, the wall masks, and the support arm masks). Because the I/O pads 308 are protected by the front side photoresist mask 375, the underlying metal layers may be preserved from being etched. Referring to FIG. 3H, a front side photoresist mask release 379 may be performed after the metal mask etching 377 is completed. At this stage, the manufacturing of the through well microbolometer 380 may be completed.

The microbolometer 380 may include an uncooled infrared detector array, which may be controlled and accessed by the readout circuit 309. The uncooled infrared detector array may include a plurality of detector pixels, each of which may include a pixel island and a wall. The walls may form a through well structure for suspending the pixel island. The first wall 351 and the second wall 353 may form a first through well 327, which may define a first front opening 328 and a first back opening 329. The first pixel island 322 may be situated within the first through well 327 and positioned adjacent to the first front opening 328. The second wall 353 and the third wall 355 may form a second through well 347, which may define a second front opening 348 and a second back opening 349. The second pixel island 342 may be situated within the second through well 347 and positioned adjacent to the second front opening 348. The third wall 355 and the fourth wall 357 may form a third through well 367, which may define a third front opening 368 and a third back opening 369. The third pixel island 362 may be situated within the third through well 367 and positioned adjacent to the third front opening 368.

Depending on the final packaging and bonding, the microbolometer 380 may receive and convert the infrared ray via the various front openings (e.g., the first, second, and third front openings 328, 348, and 368), or alternatively, via the various back openings (e.g., the first, second, and third back openings 329, 349, and 369). When the microbolometer 380 is adapted to a flip-chip packaging, the insulation layer 302 may serve as the heat absorption layer, the functional features of which may be similar to those of the heat absorption layer 112 as discussed in FIGS. 2A and 2B. In one embodiment, a titanium layer, a titanium nitride layer, and/or a layer having a material with similar physical and chemical properties may be deposited on the insulation layer 302 in the flip-chip arrangement for improving the heat absorption characteristics thereof.

Figure 4A:
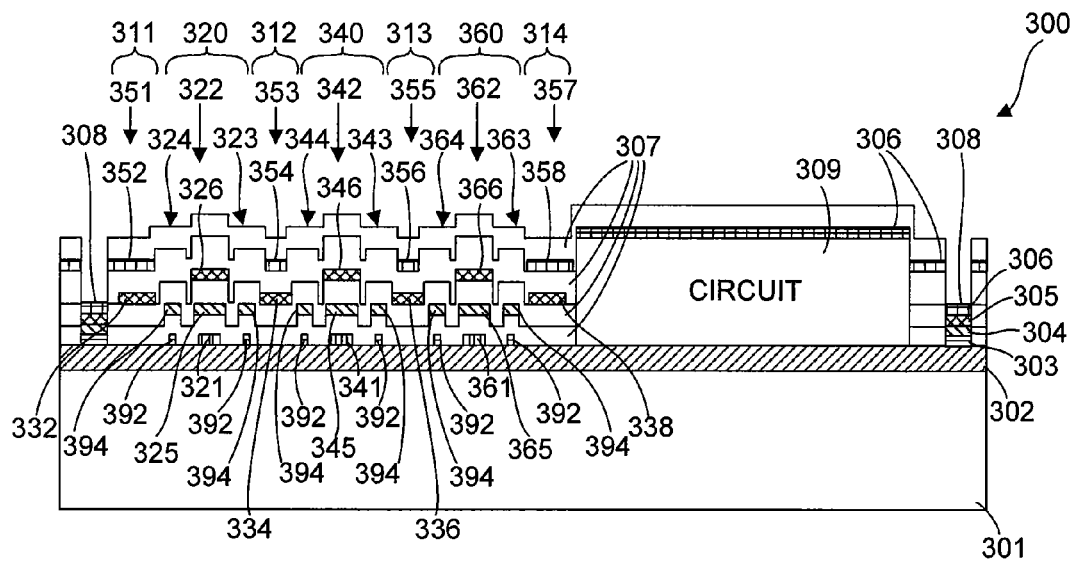
FIGS. 4A-4F show the cross-sectional views of the foundry-defined SOI-CMOS wafer being processed to form a closed well microbolometer according to an embodiment of the present invention.

FIGS. 4A-4F show the cross-sectional views of the foundry-defined SOI-CMOS wafer (or the "wafer") 300 being processed to form a closed well microbolometer 400 according to an embodiment of the present invention. Generally, because no through well is formed in the microbolometer 400, the back side vertical etching may be skipped. Instead, an anisotropic silicon etching may be performed after the front side vertical etching. Referring to FIG. 4A, the initial structure of the wafer 300 may be identical to the initial structure thereof as discussed in FIG. 3A.

Figure 4B:
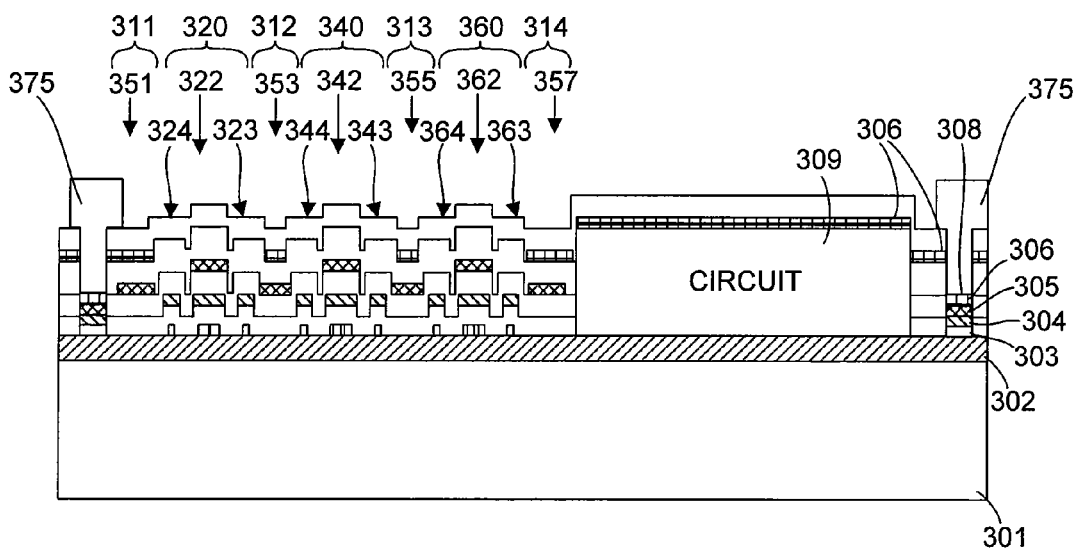

Referring to FIG. 4B, a front side photoresist mask 375 may be deposited to cover the input-output (I/O) pads 308 of the wafer 300. The photoresist mask 375 may be resistive to wet metal etching, such that it may be used for protecting the global metal layers of the I/O pads 308. In one embodiment, the photoresist mask 375 may be deposited before any front side etching is performed. In another embodiment, the photoresist mask 375 may be deposited before any wet metal etching is performed.

Figure 4C:
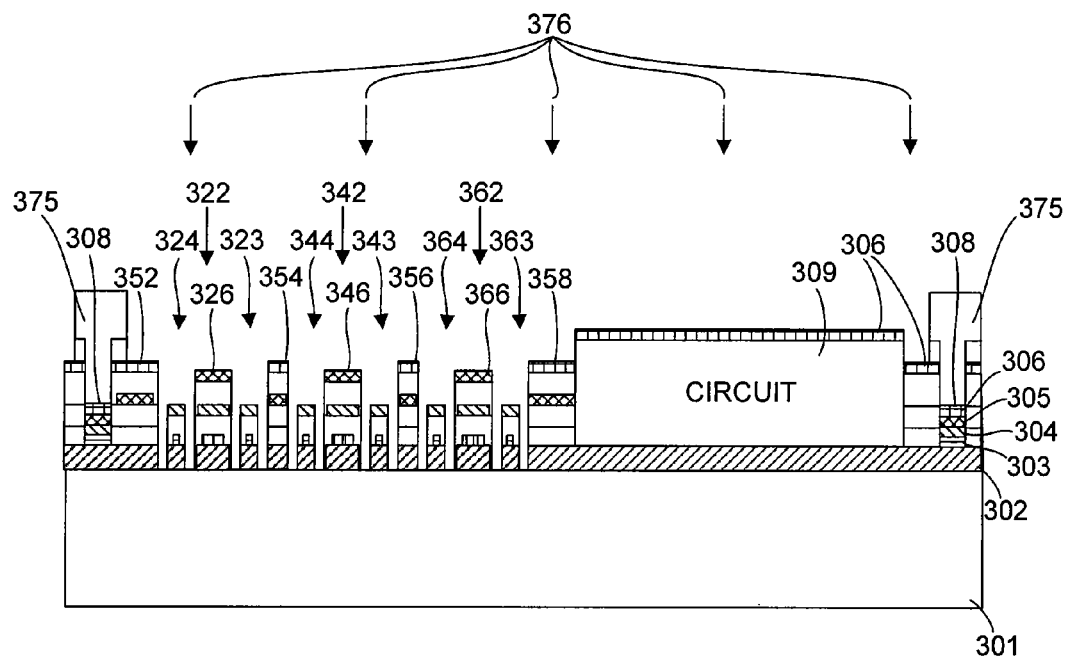

Referring to FIG. 4C, a front side dry oxide etching (a vertical etching) 376 may be performed to remove the unprotected portions of the oxide layers 307 and the unprotected portions of the insulation layer 302. As disclosed herein, the unprotected portions may be the portions that are not covered by any mask layers. For example, the portions positioned between various structures may be the unprotected portions. The purpose of the front side dry oxide etching 376 may be to define a plurality of front pixel spaces between the pixel structures (e.g., the first, second, and third pixel structures 322, 342, and 362) and the wall structures (e.g., the first, second, third, and fourth wall structures 351, 353, 355, and 357). The front side dry oxide etching 376 may be generally implemented by a front side dry dielectric etching (not shown) when one or more of the oxide layers 307 are replaced with layers that are made of other dielectric materials (e.g., a nitride material). The front side dry oxide etching 376 may include a reactive ion etching (RIE), a reactive ion-beam etching (RIBE), and/or a chemically assisted ion-beam etching (CAIBE).

The various mask layers (e.g., the pixel masks, the wall masks, the support arm masks, and the circuit mask) may be preformed by using one or more metal layers during the foundry defined SOI-CMOS process. As such, no additional post-CMOS lithographic process may be required to define these mask layers. Therefore, the front side oxide etching process may be performed at a relatively low cost and within a relatively short period of time.

Figure 4D:
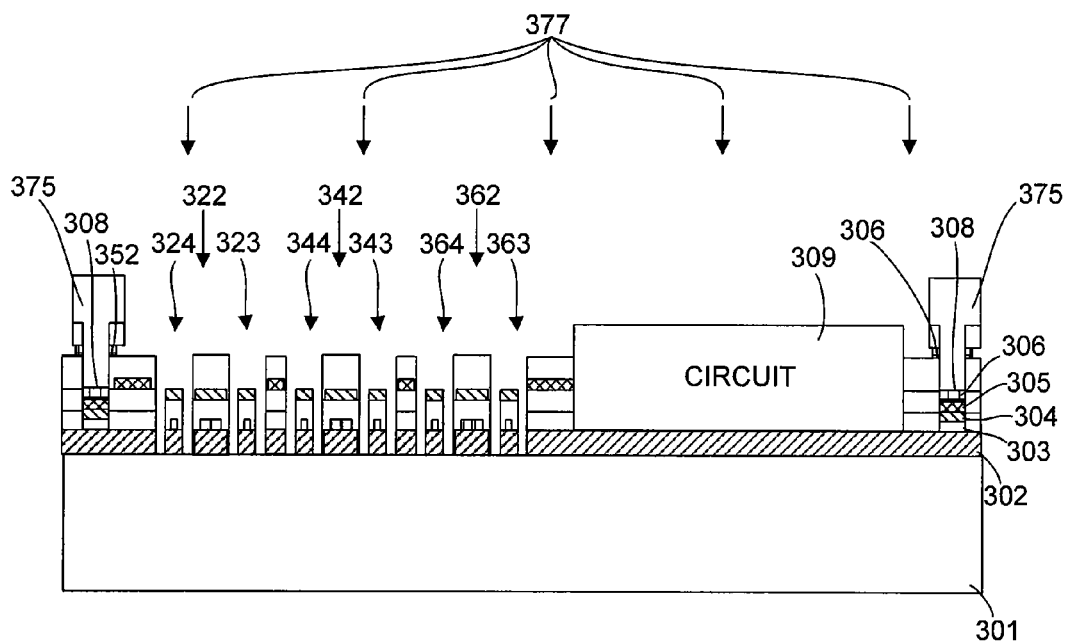
Figure 4E:
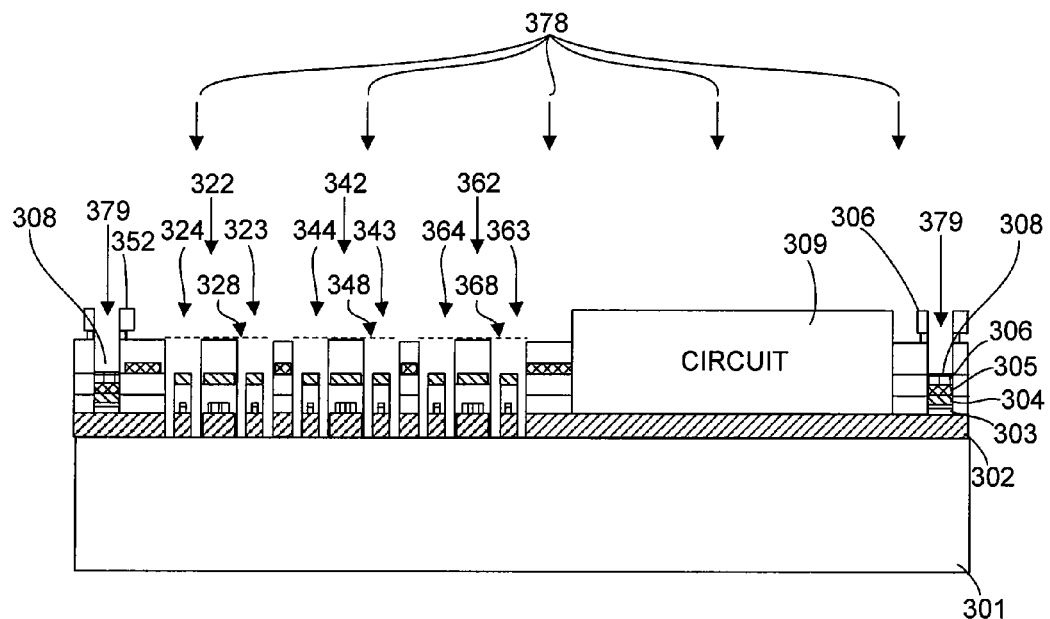

Referring to FIG. 4D, a metal mask etching (a third etching) 377 may be performed to remove the various mask layers (e.g., the pixel masks, the wall masks, and the support arm masks). Because the I/O pads 308 are protected by the front side photoresist mask 375, the underlying metal layers may be preserved from being etched. Referring to FIG. 4E, a front side photoresist mask release 379 may be performed after the metal mask etching 377 is completed.

Figure 4F:
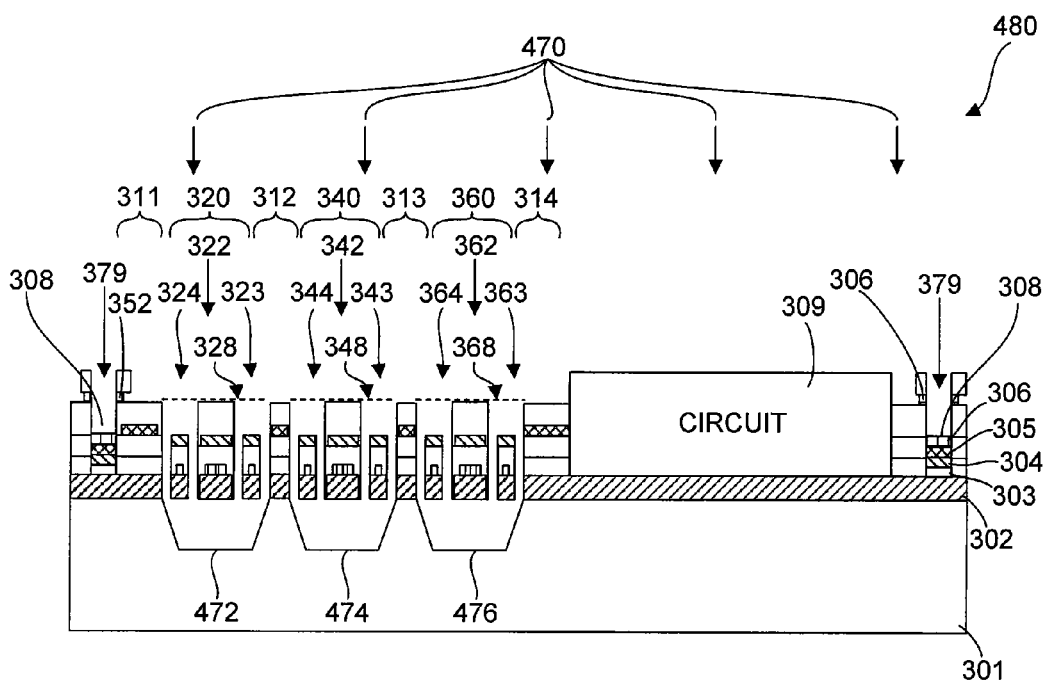

Referring to FIG. 4F, an anisotropic silicon etching 470 may be performed after the mask layers are properly removed. The anisotropic silicon etching 470 may involve introducing one or more chemical etchants to the exposed surfaces of the substrate layer 301. As disclosed herein, the exposed surfaces of the substrate layer 301 may include one or more surfaces thereon that are not covered by the insulation layer 302. Unlike conventional anisotropic silicon etching processes, the anisotropic silicon etching 470 might not require any electrochemical etch stop because the insulation layer 302 may serve as a passive etch stopper.

Accordingly, the anisotropic silicon etching 470 may eliminate the process of applying various controlled voltages to the pixel structures (e.g., the first, second, and/or third pixel structures 322, 342, and/or 362) and the substrate layer 301, which may purport to establish a potential difference therebetween. In other words, the pixel structures and the substrate layer 301 may each have a floating potential during the anisotropic silicon etching 470. The chemical etchants used in the anisotropic silicon etching 407 may include, but not limited to, ethylenediamine procatechol (EDP), tetramethylammonium hydroxide (TMAH), and/or potassium hydroxide (KOH).

As a result of the front side dry oxide etching 376 and the anisotropic silicon etching 407, the various pixel structures may become various suspended pixel islands, each of which may be held or suspended by the adjacent walls via a pair of support arms. In one embodiment, for example, the first pixel island 322 may be held or suspended by the first wall 351 and the second wall 353 via the first left support arm 324 and the first right support arm 323. In another embodiment, for example, the second pixel island 342 may be held or suspended by the second wall 353 and the third wall 355 via the second left support arm 344 and the second right support arm 343. In yet another embodiment, for example, the third pixel island 362 may be held or suspended by the third wall 355 and the fourth wall 357 via the third left support arm 364 and the third right support arm 363.

At this stage, the manufacturing of the microbolometer 400 may be completed. The microbolometer 400 may include an uncooled infrared detector array, which may be controlled and accessed by the readout circuit 309. The uncooled infrared detector array may include a plurality of detector pixels, each of which may include a pixel island and a wall. The walls may form a closed well structure for suspending the pixel island. The first wall 351 and the second wall 353 may form a first closed well 472 with the substrate layer 301. The first closed well 472 may define a cavity, on top of which the first pixel island 322 may be situated. The second wall 353 and the third wall 355 may form a second closed well 474 with the substrate layer 301. The second closed well 474 may define a cavity, on top of which the second pixel island 342 may be situated. The third wall 355 and the fourth wall 357 may form a third closed well 476 with the substrate layer 301. The third closed well 476 may define a cavity, on top of which the third pixel island 362 may be situated.

Depending on the final packaging and bonding, the microbolometer 400 may receive and convert infrared ray via the front openings, or alternatively, via the closed wells, which may include substrate silicon that is transparent to infrared ray. When the microbolometer 380 is adapted to a flip-chip packaging, the insulation layer 302 may serve as the heat absorption layer, the functional features of which may be similar to those of the heat absorption layer 112 as discussed in FIGS. 2A and 2B. In one embodiment, a titanium layer, a titanium nitride layer, and/or a layer having a material with similar physical and chemical properties may be deposited on the insulation layer 302 in the flip-chip arrangement for improving the heat absorption characteristics thereof.

Figure 5A:
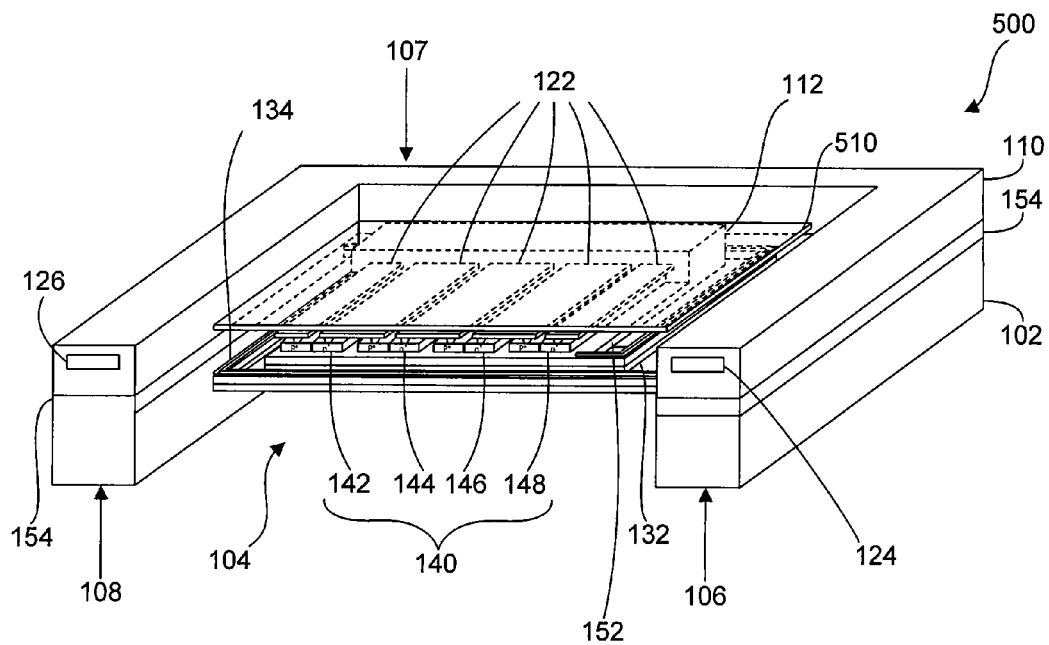
FIG. 5A shows a perspective view of an infrared detector pixel with a heat absorption umbrella according to an embodiment of the present invention.
Figure 5B:
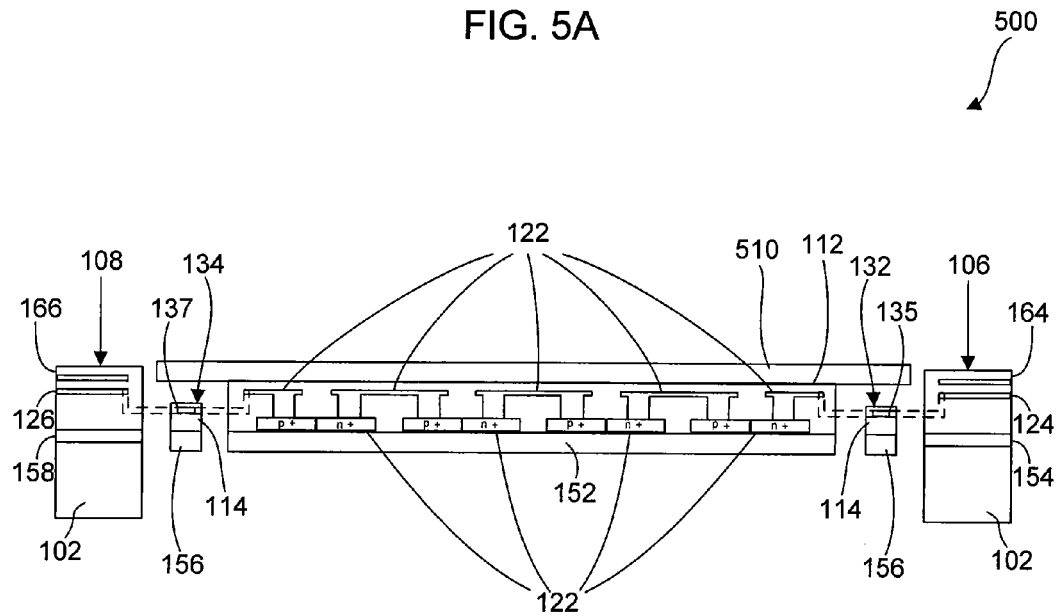
FIG. 5B shows a cross-sectional view of the infrared detector pixel with a heat absorption umbrella according to an embodiment of the present invention.

The discussion now turns to various methods for manufacturing uncooled infrared detectors with one or more heat absorption umbrellas. FIGS. 5A and 5B show a perspective view and a cross-sectional view of an infrared detector pixel 500 with a heat absorption umbrella 510 according to an embodiment of the present invention. The infrared detector pixel 500 may incorporate all the structural and functional features of the infrared detector pixel 200 as shown in FIGS. 2A and 2B. Additionally, the infrared detector 500 may include a heat absorption umbrella 510, which may be formed on top of the heat absorption layer 112.

The heat absorption umbrella 510 may have a larger surface area than the heat absorption layer 112. In one embodiment, for example, the heat absorption umbrella 510 may extend beyond the vertical space defined by the heat absorption layer 112 to cover the first support arm 132 and the second support arm 134. In another embodiment, for example, the heat absorption umbrella 510 may have an elevated wing section that protrudes from the top opening of the through well and extends to cover a portion of the through well.

Because of its larger surface area, the heat absorption umbrella 510 may enhance the uncooled infrared detector's capability of receiving and detecting infrared ray. Such enhancement may be measured by a filled factor, which may be a ratio of the surface area of the umbrella 510 to the cross sectional area of the through well. As discussed herein, the heat absorption umbrella 510 may achieve a filled factor that ranges, for example, from about 80% to about 95%. The heat absorption umbrella 510 may be made of a similar material as the heat absorption layer 112. As such, the method for manufacturing the uncooled infrared detector 500 may be monolithic, and it may be similar to the methods as discussed in FIGS. 3A-3H and 4A-4F.

FIGS. 6A-6F show the cross-sectional views of a foundry-defined silicon-on-SOI-CMOS wafer (or the "wafer") 600 being processed to form a through well microbolometer 680 with heat absorption umbrellas 682 and 684 according to an embodiment of the present invention. The wafer 600 may be similar to the wafer 300. For example, the wafer 600 may include a substrate layer (silicon handler wafer) 601, an insulation layer 602, and several oxide layers 607. Additionally, the wafer 600 may include a sacrificial layer (e.g., a first sacrificial layer 628 and/or a second sacrificial layer 648) and an umbrella layer (e.g., a first umbrella layer 627 and/or a second umbrella layer 647).

The substrate layer 601 may be made of silicon and/or other semiconducting material, and it may provide a foundation for the insulation layer 602 and the oxide layers 607. The insulation layer 602 may be made of an insulating material, such as silicon dioxide and/or silicon nitride. When the insulation layer 602 is made of an oxide material, the insulation layer 602 may be understood as a buried oxide layer (BOX). The oxide layers 607 may be formed on top of the insulation layer 602 for covering various structures (e.g., pixel structures, wall structures, and/or circuit structures) and filling in the space defined among the various structures. Moreover, the oxide layers 607 may be used for separating various conducting and/or semiconducting layers within each structure. Generally, the exposed side of the oxide layers 607 may be understood as the front side and/or the top side, and the exposed side of the substrate layer 601 may be understood as the back side and/or the bottom side.

The insulation layer 602 may define various regions for supporting various structures (e.g., pixel structures, wall structures, and/or circuit structures) thereon. In one embodiment, for example, the insulation layer 602 may define a first wall region 611, a second wall region 612, and a third wall region 613. A wall structure may be developed on top of one or more of the wall regions (e.g., the first wall region 611, the second wall region 612, and/or the third wall region 613). In another embodiment, for example, the insulation layer 602 may define a first pixel region 620 and a second pixel region 640. Each of the pixel regions 620 and 640 may be surrounded, partially or completely, by one or more wall regions (e.g., the first wall region 611, the second wall region 612, and/or the third wall region 613).

A first wall structure may be formed on the first wall region 611. The first wall structure may include a first inter-pixel metal layer 654 and a first inter-pixel mask layer 651. The first inter-pixel metal layer 654 may be used for conducting electrical signals to and from the adjacent pixel structure. The first inter-pixel mask layer 651 may cover and protect the first inter-pixel metal layer 654 and the interposing oxide layers 607. The first inter-pixel mask layer 651 may be made of a material that is resistive to the dry oxide etching. In one embodiment, for example, the first inter-pixel mask layer 651 may be made of aluminum, gold, copper, titanium, and/or other metallic material. Generally, the first inter-pixel mask layer 651 may position farther away from the insulation layer 602 than the first inter-pixel metal layer 654.

A second wall structure may be formed on the second wall region 612. The second wall structure may include a second inter-pixel metal layer 655 and a second inter-pixel mask layer 652. The second inter-pixel metal layer 655 may be used for conducting electrical signals to and from the adjacent pixel structure. The second inter-pixel mask layer 652 may cover and protect the second inter-pixel metal layer 655 and the interposing oxide layers 607. The second inter-pixel mask layer 652 may be made of a material that is resistive to the dry oxide etching. In one embodiment, for example, the second inter-pixel mask layer 652 may be made of aluminum, gold, copper, titanium, and/or other metallic material. Generally, the second inter-pixel mask layer 652 may position farther away from the insulation layer 602 than the second inter-pixel metal layer 655.

A third wall structure may be formed on the third wall region 613. The third wall structure may include a third inter-pixel metal layer 656 and a third inter-pixel mask layer 653. The third inter-pixel metal layer 656 may be used for conducting electrical signals to and from the adjacent pixel structure. The third inter-pixel mask layer 653 may cover and protect the third inter-pixel metal layer 656 and the interposing oxide layers 607. The third inter-pixel mask layer 653 may be made of a material that is resistive to the dry oxide etching. In one embodiment, for example, the third inter-pixel mask layer 653 may be made of aluminum, gold, copper, titanium, and/or other metallic material. Generally, the third inter-pixel mask layer 653 may position farther away from the insulation layer 602 than the third inter-pixel metal layer 656.

A first pixel structure may be formed on the first pixel region 620, such that it may be surrounded by the first and second wall structures. The first pixel structure may include a first diode group 621, a first intra-pixel metal layer 625, and a first intra-pixel mask layer 626. The first diode group 621 may have similar functional and structural features as the diode group 140. The first intra-pixel metal layer 625 may have similar functional and structural features as the inter-diode metallic plates 122. The first intra-pixel mask layer 626 may cover and protect the first diode group 621, the first intra-pixel metal layer 625, and the oxide layers 607 positioned therebetween. The first intra-pixel mask layer 626 may be made of a material that is resistive to the dry oxide etching. In one embodiment, for example, the first intra-pixel mask layer 626 may be made of aluminum, gold, copper, titanium, and/or other metallic material. Generally, the first intra-pixel mask layer 626 may position farther away from the insulation layer 602 than the first intra-pixel metal layer 625.

A rim of first sacrificial layer 628 may be formed on top of the oxide layer 607 that covers the support arm structures and/or adjacent to the oxide layer 607 that covers the first intra-pixel metal layer 625. Subsequently, a first umbrella layer 627 may be formed on top of the first sacrificial layer 628 and the oxide layer 607 that covers the first intra-pixel metal layer 625. Depending on the types of etching to be performed on the front side and the back side, the first sacrificial layer 628 may be made of a material that is resistive to the etching of the substrate layer 601, the insulation layer 602, and the oxide layers 607. In one embodiment, the first sacrificial layer 628 may be made of the same material as the global Metal-2 layer 605. In another embodiment, the first sacrificial layer 628 may be made of the same material as the first intra-pixel mask layer 626. In yet another embodiment, the first sacrificial layer 628 may be made of the same material as the first intra-pixel metal layer 625.

The first sacrificial layer 628 may form a sandwich structure with the first intra-pixel mask layer 626 to protect the first umbrella layer 627. In this manner, the first sacrificial layer 628 may cooperate with the first intra-pixel mask layer 626 to provide the first umbrella layer 627 with structural support before and during the etching of the oxide layers 607, the insulation layer 602, and the substrate layer 601.

The first umbrella layer 627 may be made of a heat absorption material for receiving infrared ray and converting the received infrared ray to heat. In one embodiment, the first umbrella layer 627 may be made of the same material as the heat absorption layer 112. In another embodiment, the first umbrella layer 627 may be made of an oxide. In yet another embodiment, the first umbrella layer 627 may be made of a nitride. Depending on the thickness of the first sacrificial layer 628, the first umbrella layer 627 may have a rim of elevated wing section that extends beyond the height of one or more wall structures. Advantageously, the elevated wing section may enhance the heat absorption characteristic of the pixel island without degrading the thermal isolation characteristic thereof.

A second pixel structure may be formed on the second pixel region 640, such that it may be surrounded by the second and third wall structures. The second pixel structure may include a second diode group 641, a second intra-pixel metal layer 645, and a second intra-pixel mask layer 646. The second diode group 641 may have similar functional and structural features as the diode group 140. The second intra-pixel metal layer 645 may have similar functional and structural features as the inter-diode metallic plates 122. The second intra-pixel mask layer 646 may cover and protect the second diode group 641, the second intra-pixel metal layer 645, and the oxide layers 607 positioned therebetween. The second intra-pixel mask layer 646 may be made of a material that is resistive to the dry oxide etching. In one embodiment, for example, the second intra-pixel mask layer 646 may be made of aluminum, gold, copper, titanium, and/or other metallic material. Generally, the second intra-pixel mask layer 646 may position farther away from the insulation layer 602 than the second intra-pixel metal layer 645.

A rim of second sacrificial layer 648 may be formed on top of the oxide layer 607 that covers the support arm structures and/or adjacent to the oxide layer 607 that covers the second intra-pixel metal layer 645. Subsequently, a second umbrella layer 647 may be formed on top of the second sacrificial layer 648 and the oxide layer 607 that covers the second intra-pixel metal layer 645. Depending on the types of etching to be performed on the front side and the back side, the second sacrificial layer 648 may be made of a material that is resistive to the etching of the substrate layer 601, the insulation layer 602, and the oxide layers 607. In one embodiment, the second sacrificial layer 648 may be made of the same material as the global Metal-2 layer 605. In another embodiment, the second sacrificial layer 648 may be made of the same material as the second intra-pixel mask layer 646. In yet another embodiment, the second sacrificial layer 648 may be made of the same material as the second intra-pixel metal layer 645.

The second sacrificial layer 648 may form a sandwich structure with the second intra-pixel mask layer 646 to protect the second umbrella layer 647. In this manner, the second sacrificial layer 648 may cooperate with the second intra-pixel mask layer 646 to provide the second umbrella layer 647 with structural support before and during the etching of the oxide layers 607, the insulation layer 602, and the substrate layer 601.

The second umbrella layer 647 may be made of a heat absorption material for receiving infrared ray and converting the received infrared ray to heat. In one embodiment, the second umbrella layer 647 may be made of the same material as the heat absorption layer 112. In another embodiment, the second umbrella layer 647 may be made of an oxide. In yet another embodiment, the second umbrella layer 647 may be made of a nitride. Depending on the thickness of the second sacrificial layer 648, the second umbrella layer 647 may have a rim of elevated wing section that extends beyond the height of one or more wall structures. Advantageously, the elevated wing section may enhance the thermal isolation characteristic of the pixel island.

A pair of support arm structures may be formed adjacent to each of the pixel structures. Each of the support arm structures may be positioned between the respective pixel structure and an adjacent wall structure. Similar to the first and second support arms 132 and 134 as shown in FIGS. 2A and 2B, the pair of support arm structures may provide mechanical and electrical connections between the pixel structure and the adjacent wall structures. Each of the support arm structure may include a polysilicon wire and a support arm mask layer. The polysilicon wire may be used for establishing an electrical connection between the pixel structure and one of the adjacent wall structures. The support arm mask layer may cover and protect the polysilicon wire.

The wafer 600 may include a readout circuit 609 for interacting with one or more diode groups (e.g., the first diode group 621 and the second diode group 641). The readout circuit 609 may be configured to select one or more diode groups, to bias the selected diode groups, to receive sensing signals from the selected diode groups, and/or to amplify the received sensing signals. In order to communicate with the diode groups, the readout circuit 609 may be routed with various conductive layers, such as a global polysilicon layer 603, a global Metal-1 layer 604, a global Metal-2 layer 605, and a global Metal-3 layer 606. Generally, the global Metal-3 layer 606 may be used as a mask layer for protecting other parts of the wafer 600. For example, the Metal-3 layer 606 may be used for protecting the readout circuit 609 during a dry oxide etching. Moreover, the Metal-3 layer 606 may be used for forming any of the other mask layers, such as the inter-pixel mask layers, the intra-pixel mask layers, and/or the support arm mask layers.

Figure 6A:
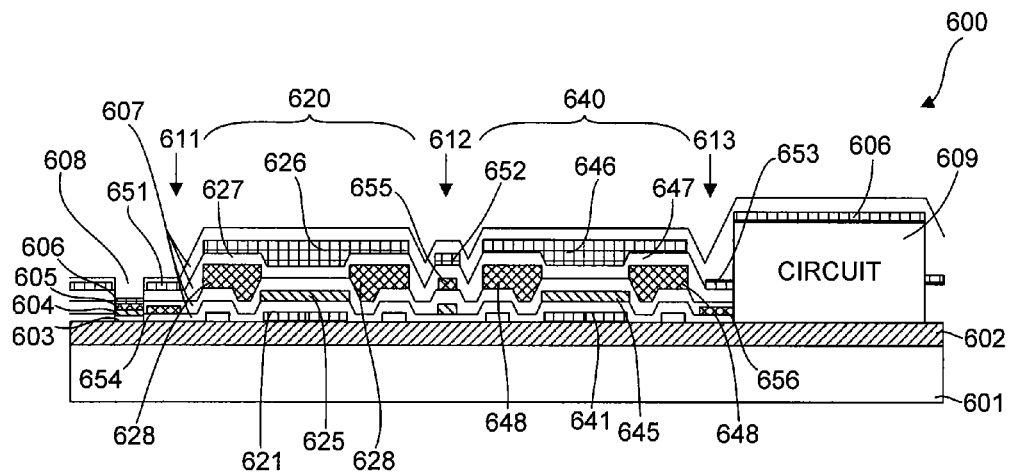
FIGS. 6A-6F show the cross-sectional views of a foundry-defined silicon-on-SOI-CMOS wafer being processed to form a through well microbolometer with heat absorption umbrellas according to an embodiment of the present invention.
Figure 6B:
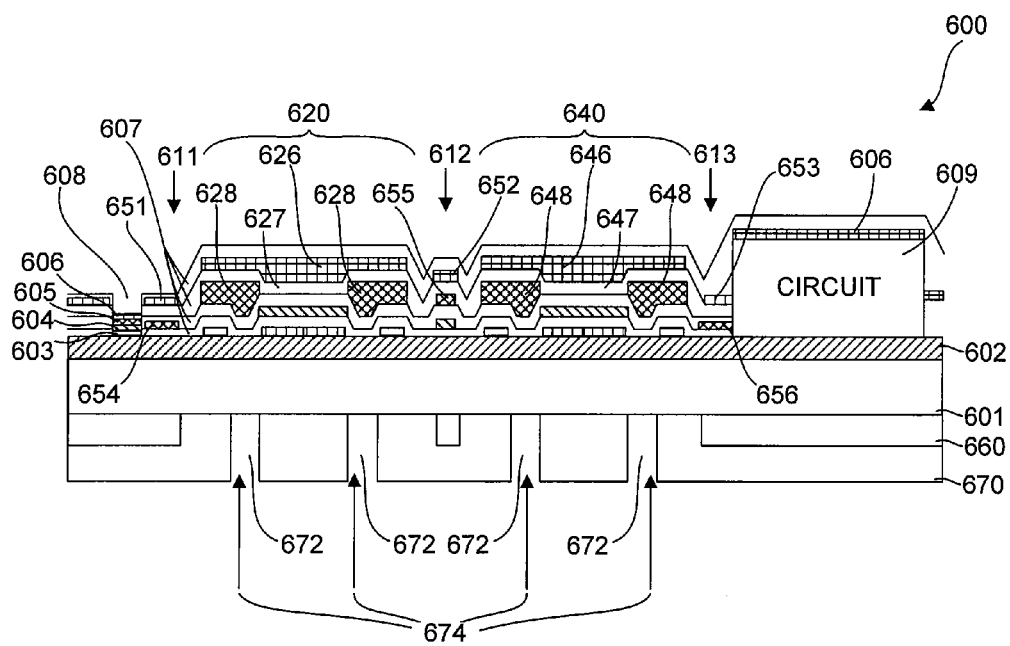

Referring to FIG. 6B, a first back side mask 660 and a second back side mask 670 may be coated on the back side of the wafer 600. The first back side mask 660 may be made of a material that is resistive to silicon etching. In one embodiment, for example, the first back side mask 660 may be made of a nitride. In another embodiment, for example, the back side mask 660 may be made of an oxide. In yet another embodiment, for example, the back side mask 660 may be made of a photoresist material. The second back side mask 670 may be made of a material that is resistive to silicon etching, oxide etching, and/or nitride etching. In one embodiment, for example, the second back side mask 670 may be made of a photoresist material.

The first back side mask 660 may define a plurality of first apertures 671, each of which may vertically align with one pixel region (e.g., the first pixel region 620 or the second pixel region 640). The plurality of first apertures 671 may be used for directing back side the silicon etching of the silicon substrate layer 601, so as to remove only the portions that vertically overlap with the pixel regions of the insulation layer 602.

The second back side mask 670 may define a plurality of second apertures 672, each of which may vertically align with a space defined between one support arm structure and an adjacent pixel structure. The plurality of second apertures 672 may be used for directing the back side silicon etching of the silicon substrate layer 601, the back side insulation etching of the insulation layer 602, and the back side oxide etching of the oxide layers 607. Each of the plurality of second apertures 672 may be used for directing the removal of a portion of the oxide layers 607 and a portion of the insulation layer 602, both of which may be formed between one support arm structure and an adjacent pixel structure. As such, each of the first apertures 671 may overlap with a pair of second apertures 672, and each of the first apertures 671 may be substantially wider than each of the second apertures 672.

A first back side deep dry etching 674 may be performed after the coating of the first back side mask 660 and the second back side mask 670. The first back side deep dry etching 674 may etch away the uncovered portions (i.e., the portions aligned with the second back side apertures 672) of the substrate layer 601, the insulation layer 602, and the oxide layers 607. The first back side deep dry etching 674 may be terminated or stopped at the sacrificial layers (e.g., the first sacrificial layer 628 and/or the second sacrificial layer 648). Consequently, various back side tunnels may be defined. In one embodiment, a first left back side tunnel 636 and a first right back side tunnel 637 may be defined between the first pixel structure and the adjacent support arm structures. In another embodiment, a second left back side tunnel 638 and a second right back side tunnel 639 may be defined between the second pixel structure and the adjacent support arm structures.

Figure 6C:
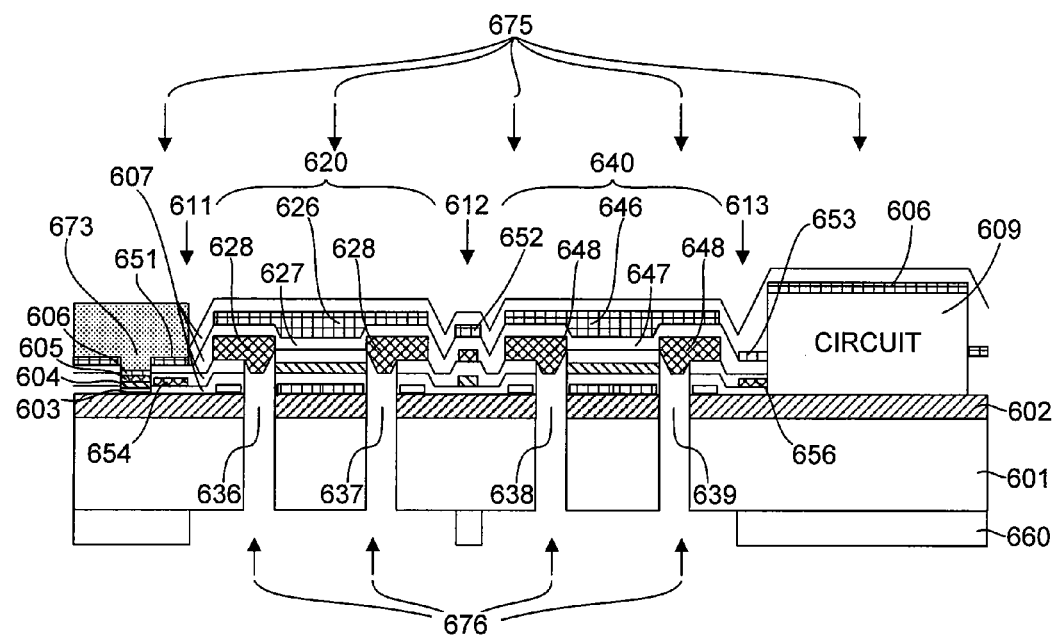

Referring to FIG. 6C, a second back side mask removal 676 may be performed after the first back side deep dry etching 674 is performed. At this stage, the back side of the wafer 600 may be only covered by the first back side mask 660. Moreover, a front side photoresist mask 673 may be deposited to cover the input-output (I/O) pads 608 of the wafer 600. The photoresist mask 673 may be resistive to wet metal etching, such that it may be used for protecting the global metal layers of the I/O pads 608. In one embodiment, the photoresist mask 673 may be deposited before any front side etching is performed. In another embodiment, the photoresist mask 673 may be deposited before any wet metal etching is performed.

Furthermore, a front side dry etching 675 may be performed to remove the unprotected portions of the oxide layers 607 and the unprotected portions of the insulation layer 602. As disclosed herein, the unprotected portions may be the portions that are not covered by any mask layers. For example, the portions positioned between various structures may be the unprotected portions. The purpose of the front side dry etching 675 may be to define a plurality of front pixel spaces between the pixel structures and the wall structures. The front side dry etching 675 may include a reactive ion etching (RIE), a reactive ion-beam etching (RIBE), and/or a chemically assisted ion-beam etching (CAIBE).

The various mask layers (e.g., the pixel masks, the wall masks, the support arm masks, and the circuit mask) may be preformed by using one or more metal layers during the foundry defined SOI-CMOS process. As such, no additional post-CMOS lithographic process may be required to define these mask layers. Therefore, the front side oxide etching process may be performed at relatively low cost and within a relatively short period of time.

Figure 6D:
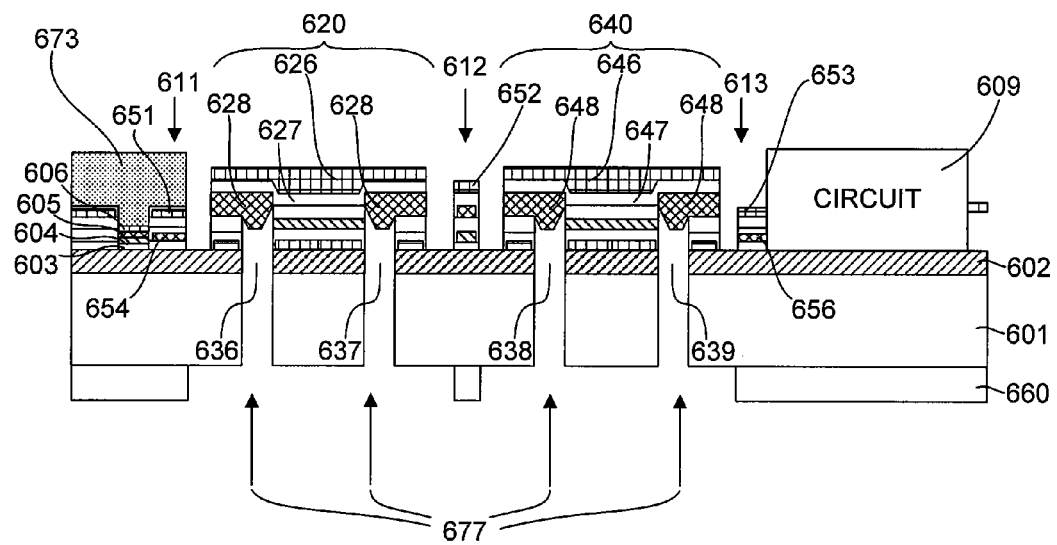

Referring to FIG. 6D, a second back side deep dry etching 677 may be performed after the second back side mask removal 676 is performed. The second back side deep dry etching 677 may etch away the uncovered portions (i.e., the portions aligned with the first back side apertures 671) of the substrate layer 601. The back side deep dry etching 676 may be terminated or stopped at the insulation layer 602.

As a result of the second deep dry etching 677, a first back pixel space 681 and a second back pixel space 683 may be defined within and throughout the substrate layer 601. The first and second back pixel spaces 681 and 683 may align with the respective first and second pixel regions 620 and 640, thereby allowing air to circulate to the first and second pixel structures. The first and second deep dry etchings 674 and 677 may each be a deep reactive ion etching (DRIE) or other types of vertical silicon etchings.

A plurality of wall strips may extend from the wall regions of the insulation layer 602 after the first and second back pixel spaces 681 and 683 are defined. For example, a first wall strip 615 may extend from the first wall region 611; a second wall strip 616 may extend from the second wall region 612; and a third wall strip 617 may extend from the third wall region 613. Each of the wall strips may have an aspect ratio, which may be defined as a ratio of the length of the wall strip to the width of the wall strip. To improve the thermal isolation feature of the uncooled infrared detector, it is desirable to have a relatively high aspect ratio. In one embodiment, for example, each of the wall strips may have an aspect ratio of about 10.

Figure 6E:
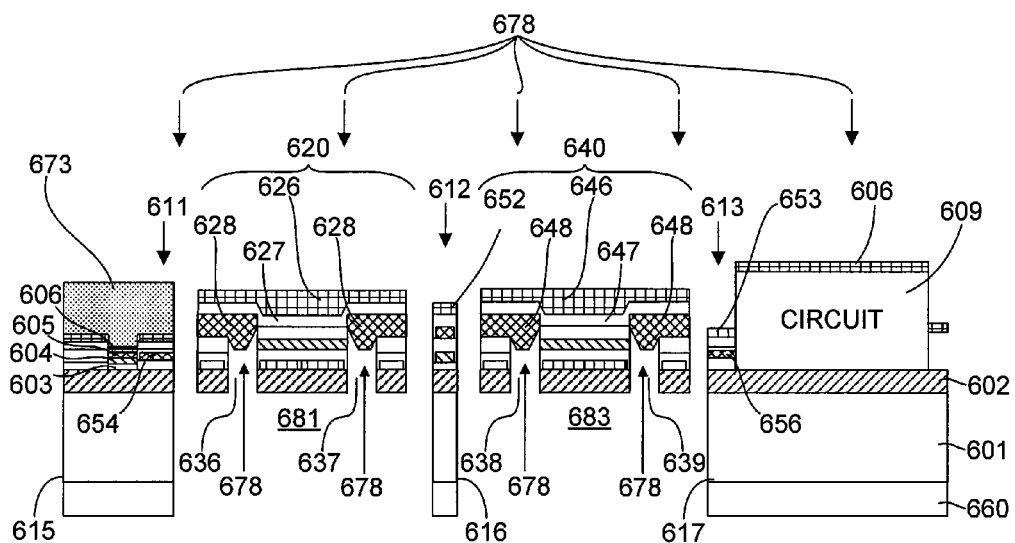

Referring to FIG. 6E, a wet metal mask etching 678 may be performed to remove the various layers that are made of one or more metallic materials. These layers may include, but are not limited to, the protection mask (e.g., the pixel masks, the wall masks, and the support arm masks) and the sacrificial layers (e.g., the first and second sacrificial layers 628 and 648). Because the I/O pads 608 are protected by the front side photoresist mask 673, the underlying metal layers may be preserved from being etched. Moreover, the first back side mask 660 may be removed before or after the wet metal mask etching 678 is performed so as to free up the back side of the wafer 600.

Figure 6F:
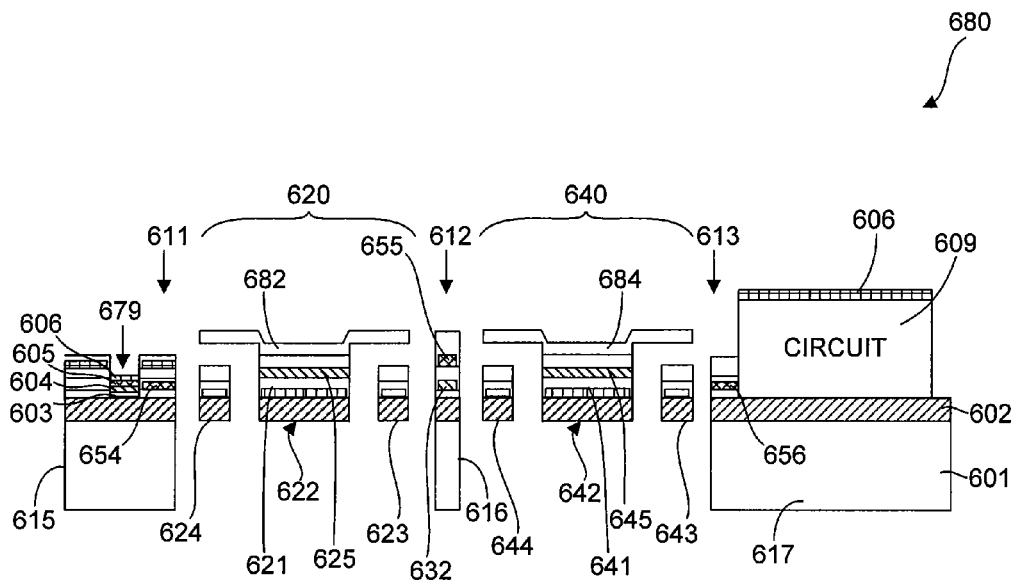

Referring to FIG. 6F, the various pixel structures may become various suspended pixel islands after the front side dry etching 675, the second back side deep dry etching 677, and the wet metal mask etching 678 are performed. Each of the pixel islands may be held or suspended by the adjacent walls via a pair of support arms. In one embodiment, for example, the first pixel island 622 may be held or suspended by the first wall and the second wall via the first left support arm 624 and the first right support arm 623. In another embodiment, for example, the second pixel island 642 may be held or suspended by the second wall and the third wall via the second left support arm 644 and the second right support arm 643.

After the sacrificial layers are removed, the first umbrella layer 627 may become a first heat absorption umbrella 682, and the second umbrella layer 647 may become a second heat absorption umbrella 684. The first and second heat absorption umbrellas 682 and 684 may increase the total infrared reception area (filled factor) of the respective first and second pixel islands 622 and 624. As a result, the first and second heat absorption umbrellas 682 and 684 may enhance the sensitivity of the first and second pixel islands 622 and 642 respectively.

Upon the completion of the wet metal mask etching 678, a front side photoresist release 679 may be performed to release the front side photoresist mask 673. At this stage, the manufacturing method of the through well microbolometer 680 may be completely. The microbolometer 680 may include an uncooled infrared detector array, which may be controlled and accessed by the readout circuit 609. The uncooled infrared detector array may include a plurality of detector pixels, each of which may include a pixel island and a plurality of walls. The walls may form a through well for suspending the pixel island. Accordingly, the microbolometer 680 may include multiple through wells, each of which may be partially covered by one heat absorption umbrella (e.g., the first heat absorption umbrella 682 and/or the second heat absorption umbrella 684). Moreover, each of the multiple through wells may have similar structure and arrangement as the through wells as described in FIG. 3H.

Depending on the final packaging and bonding, the microbolometer 680 may receive and convert the infrared ray via the various front openings, or alternatively, via the various back openings. When the microbolometer 380 is adapted to a flip-chip packaging, the insulation layer 602 may serve as the heat absorption layer, the functional features of which may be similar to those of the heat absorption layer 112 as discussed in FIGS. 2A and 2B.

Figure 7A:
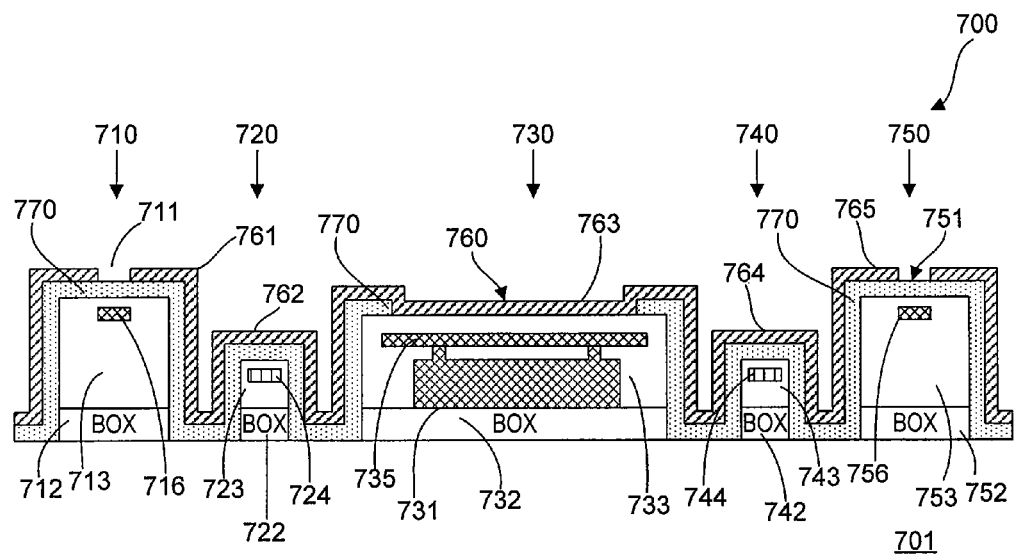
FIGS. 7A-7B show the cross-sectional views of a post-CMOS processed wafer being further processed to form a closed well microbolometer with a heat absorption umbrella according to an embodiment of the present invention.
Figure 7B:
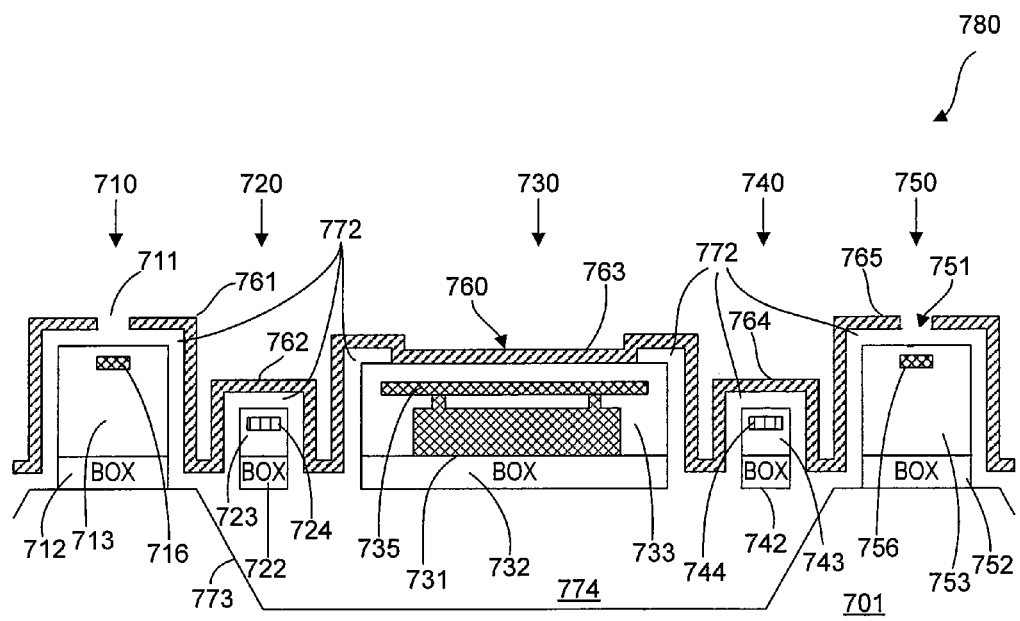

FIGS. 7A-7B show the cross-sectional views of a post-CMOS processed wafer (or the "wafer") 700 being further processed to form a closed well microbolometer 780 with a heat absorption umbrella 760 according to an embodiment of the present invention. The wafer 700 may be a foundry-defined SOI-CMOS wafer that has received several post-CMOS process steps. In one embodiment, for example, the wafer 700 may be a foundry-defined SOI-CMOS wafer that has received a front dry oxide etching but before receiving an anisotropic silicon etching. In another embodiment, for example, the wafer 700 may be similar to the partially processed wafer 300 as shown in FIG. 4E and according to the manufacturing method as discussed therein.

Referring to FIG. 7A, a unit segment of the wafer 700 is shown. The unit segment may include a substrate layer 701 and various structures, such as the pixel structure, the wall structures, and the support arm structures. Each of the structures may be positioned on top of a respective region. In one embodiment, a first wall structure may be formed on a first wall region 710, and a second wall structure may be formed on a second wall region 750. In another embodiment, a pixel structure may be formed on a pixel region 730. In yet another embodiment, a first support arm structure may be formed on a first support arm region 720, and a second support arm structure may be formed on a second support arm region 740.

The first wall structure may include a first wall buried oxide layer 712, a first wall oxide layer 713, and a first wall metal layer 716. The second wall structure may include a second wall buried oxide layer 752, a second wall oxide layer 753, and a second wall metal layer 756. The pixel structure may be positioned between the first and second wall structures. The pixel structure may include a pixel buried oxide layer 732, a diode group 731, a pixel heat absorption layer 733, and a pixel metal layer 735.

The first support arm structure may be positioned between the first wall structure and the pixel structure. The first support arm structure may include a first support arm buried oxide layer 722, a first support arm oxide layer 723, and a first support arm polysilicon layer 724. The second support arm structure may be positioned between the second wall structure and the pixel structure. The second support arm structure may include a second support arm buried oxide layer 742, a second support arm oxide layer 743, and a second support arm polysilicon layer 744. The functional features and arrangement of the components within each of the wall structures, pixel structure, and support arm structures may be similar to those as discussed in FIGS. 3A and 4A.

After the front dry oxide etching, these structures may be laterally separated from one another, although they are still attached to a common substrate layer 701. According to an embodiment of the present invention, a silicon layer 770 may be deposited on the processed wafer 700 to cover the various structures and to fill in the lateral spaces defined among these structures. The silicon layer 770 may contain a silicon material, such as amorphous silicon, which may be later etched away by the anisotropic silicon etching. The deposited silicon layer 770 may serve as a sacrificial layer, which may provide structural support for the to-be-deposited umbrella layer 760.

Moreover, the deposited silicon layer 770 may define the surface profile of the to-be-deposited umbrella layer 760. In one embodiment, for example, if a flat umbrella layer 760 is desired, a thick silicon layer 770 may be deposited and then smoothened out by a chemical mechanical planarization (CMP) process. In another embodiment, for example, if a convoluted umbrella layer 760 is desired, a thin silicon layer 770 may be deposited such that the umbrella layer 760 may follow the contour of the underlying structures.

In order to establish a thermal contact between the umbrella layer 760 and the pixel heat absorption layer 733, a portion of the deposited silicon layer 770 may be patterned and removed before depositing the umbrella layer 760. For example, the portion of the deposited silicon layer 770 positioned on the top surface of the pixel heat absorption layer 733 may be removed.

Consequently, the umbrella layer 760 may be deposited on the deposited silicon layer 770. The umbrella layer 760 may combine various dielectric layers and metal layers to match the characteristic impedance of the pixel heat absorption layer 733 to that of the free space. As a result, the umbrella layer 760 may help minimize the surface reflection of infrared ray, which may enhance the sensitivity of the uncooled infrared detector. The umbrella layer 760 may be subdivided into a group of umbrellas, such as a first wall umbrella 761, a left arm umbrella 762, a pixel (main) umbrella 763, a right arm umbrella 764, and a second wall umbrella 765.

A selective etching process may be performed to pattern the umbrella layer 760. The patterning may define one or more apertures for introducing the anisotropic silicon etchant to remove the silicon layer 770 and to define a closed well within the substrate layer 701. In one embodiment, for example, a first umbrella aperture 711 may be defined for introducing anisotropic silicon etchant from the first wall structure. In another embodiment, for example, a second umbrella aperture 751 may be defined for introducing anisotropic silicon etchant from the second wall structure. Together, the first and second umbrella apertures 711 and 751 may set the boundary of the umbrella layer 760. The first and second umbrella apertures 711 and 751 may be a point aperture, an extended aperture, a line aperture, and/or an aperture with various dimensions and shapes.

Although FIG. 7A show that two apertures are defined within a unit segment, various numbers of apertures may be defined on the umbrella layer 760 according to various embodiments of the present invention. In order to expedite the anisotropic silicon etching, for example, additional umbrella apertures may be defined on the pixel umbrella 763, the left arm umbrella 762, and/or the right arm umbrella 764.

After the umbrella apertures are defined, the anisotropic silicon etching may begin. As disclosed herein, the anisotropic silicon etching may be similar to the anisotropic silicon etching 470 as discussed in FIG. 4F. Hence, the anisotropic silicon etching might not require any electrochemical etch stop because the insulation layer 302 may serve as a passive etch stopper.

Accordingly, the anisotropic silicon etching may eliminate the process of applying various controlled voltages to the pixel and the substrate layer 701, which may purport to establish a potential difference therebetween. In other words, the pixel structures and the substrate layer 701 may each have a floating potential during the anisotropic silicon etching. The chemical etchants used in the anisotropic silicon etching 407 may include, but not limited to, ethylenediamine procatechol (EDP), tetramethylammonium hydroxide (TMAH), and/or potassium hydroxide (KOH).

As shown in FIG. 7B, a closed well 773 may be formed within the substrate layer 701 after the completion of the anisotropic silicon etching. The closed well 773 may define a cavity (back side isolation space) 774 directly underneath the pixel buried oxide layer 732. The cavity 774 may provide thermal isolation between the pixel island and the adjacent walls, such that the heat absorption in one pixel cell might not affect the infrared detection of an adjacent pixel cell.

Exemplary embodiments of the invention have been disclosed in an illustrative style. Accordingly, the terminology employed throughout should be read in a non-limiting manner. Although minor modifications to the teachings herein will occur to those well versed in the art, it shall be understood that what is intended to be circumscribed within the scope of the patent warranted hereon are all such embodiments that reasonably fall within the scope of the advancement to the art hereby contributed, and that that scope shall not be restricted, except in light of the appended claims and their equivalents.

What is claimed is:

1. A silicon-on-insulator (SOI) complementary metal oxide semiconductor (CMOS) wafer for use in manufacturing an uncooled microbolometer, the SOI-CMOS wafer comprising:
    a substrate layer;
    an insulation layer formed on the substrate layer, the insulation layer having a pixel region and a wall region surrounding the pixel region;
    a pixel structure formed on the pixel region of the insulation layer;
    a wall structure formed adjacent to the pixel structure and on the wall region of the insulation layer;
    a dielectric layer covering the pixel structure and the wall structure;
    a pixel mask formed within the dielectric layer, and for protecting the pixel structure during a dry etching process; and
    a wall mask formed within the dielectric layer, and for protecting the wall structure during the dry etching process, thereby releasing a space defined between the wall structure and the pixel structure after the dry etching process.

2. The SOI-CMOS wafer of claim 1, wherein:
    the pixel mask includes a first metallic layer having a square shape, and
    the wall mask includes a second metallic layer having a square frame surrounding but without contacting the first metallic layer.

3. The SOI-CMOS wafer of claim 2, wherein the first metallic layer is closer to the substrate layer than the second metallic layer.

4. The SOI-CMOS wafer of claim 1, wherein the dielectric layer includes:
an umbrella layer formed between the pixel structure and the pixel mask, such that the umbrella layer is protected by the pixel mask during the dry etching process.

5. The SOI-CMOS wafer of claim 4, wherein the umbrella layer extends to cover a portion of the wall structure.

6. The SOI-CMOS wafer of claim 4, further comprising:
a sacrificial layer formed under the umbrella layer and adjacent to the pixel structure, the sacrificial layer supporting the umbrella layer before the dry etching process and protecting the umbrella structure during the dry etching process.

7. The SOI-CMOS wafer of claim 1, wherein the pixel structure includes:
a plurality of diodes formed on the pixel region of the insulation layer,
an intra-pixel metal layer formed over the plurality of diodes, and serially connecting the plurality of diodes, and
a heat absorption layer formed on the pixel region of the insulation layer, and cooperating with the insulation layer to substantially encapsulate the plurality of diodes and the intra-pixel metal layer.

8. The SOI-CMOS wafer of claim 1, wherein the dielectric layer fills the space defined between the pixel structure and the wall structure.

9. The SOI-CMOS wafer of claim 1, further comprising:
a support arm structure formed on the insulation layer, and connecting the pixel structure and the wall structure, and
a support arm mask formed within the dielectric layer, and protecting the support arm structure during the dry etching process.

10. The SOI-CMOS wafer of claim 1, wherein the support arm mask is closer to the substrate layer than the pixel mask.

11. An infrared detector manufactured from a foundry-defined silicon-on-insulator (SOI) complementary metal oxide semiconductor (CMOS) wafer, the infrared detector comprising:
a plurality of walls forming a through well defining a first opening and a second opening opposing the first opening;
an infrared sensor configured to detect an infrared wave passing through one of the first opening or the second opening of the through well; and
a support arm connecting the sensor to at least one of the plurality of walls so as to suspend the infrared sensor within the through well and adjacent to the first opening.

12. The infrared detector of claim 11, wherein the through well has a square frame cross section surrounding but without contacting the infrared sensor.

13. The infrared detector of claim 11, further comprising:
a plurality of strips, each extending from one of the plurality of walls and beyond the second opening of the through well.

14. The infrared detector of claim 11, wherein the infrared detector includes:
an insulation layer,
a plurality of diodes, each having a p-n junction substantially perpendicular to the insulation layer,
an intra-pixel metal layer position over the plurality of diodes, and serially connecting the plurality of diodes to form a diode chain, and
a heat absorption layer cooperating with the insulation layer for substantially encapsulating the diode chain.

15. The infrared detector of claim 11, wherein the support arm includes:
a polysilicon wire electrically connected to the infrared sensor, and
a thermal resistance layer encapsulating the polysilicon wire and physically supporting the suspended infrared sensor.

16. The infrared detector of claim 11, wherein:
at least one of the plurality of walls includes a readout wire, and
the support arm includes a polysilicon wire electrically connecting the readout wire to the infrared sensor.

17. The infrared detector of claim 11, further comprising:
an umbrella layer formed on the infrared sensor, and extending beyond a cross section of the infrared sensor to substantially cover the first opening but without contacting the through well.

18. The infrared detector of claim 11, further comprising:
an umbrella layer formed on the infrared sensor, and extending beyond a cross section of the infrared sensor and the first opening to cover a portion of the plurality of the walls.

19. A method for manufacturing an uncooled infrared detector from a foundry-defined silicon-on-insulator (SOI) complementary metal oxide semiconductor (CMOS) wafer having a substrate layer, an insulation layer formed on the substrate layer and having a pixel region and a wall region surrounding the pixel region, a pixel structure formed on the pixel region of the insulation layer, a wall structure formed adjacent to the pixel structure and on the wall region of the insulation layer, a dielectric layer covering the pixel structure and the wall structure, a pixel mask formed within the dielectric layer and covering the pixel structure, and a wall mask formed within the dielectric layer and covering the wall structure, the method comprising the steps of:
performing a first vertical etching through a portion of the substrate layer to define a back pixel space terminated by the pixel region of the insulation layer;
performing a second vertical etching through a portion of the dielectric layer not covered by the pixel mask and the wall mask and through a portion of the insulation layer not covered by the pixel mask and the wall mask, so as to define a front pixel space for separating the pixel structure from the wall structure; and
removing the pixel mask and the wall mask.

20. The method of claim 19, wherein the front pixel space joins the back pixel space to define a through space extending through the SOI-CMOS wafer.

21. The method of claim 19, further comprising the steps of:
depositing a photoresist layer to cover an input-output pad structure of the SOI-CMOS wafer before the second vertical etching; and
removing the photoresist layer after the second vertical etching.

22. The method of claim 19, wherein:
the SOI-CMOS wafer has a front side and a back side,
the front side is positioned on the dielectric layer and faces away from the insulation layer,
the back side is position on the substrate layer and faces away from the insulation layer,
the first vertical etching is performed on the back side of the SOI-CMOS wafer, and
the second vertical etching is performed on the front side of the SOI-CMOS wafer.

23. The method of claim 22, wherein the first vertical etching includes the steps of:
depositing a back side mask to cover the back side of the substrate layer,
performing a lithography to define an aperture on the back side mask, the aperture vertically overlapping with the pixel region of the insulation layer,
etching a vertical portion of the substrate layer through the aperture, and
removing the back side mask.

24. The method of claim 22, further comprising the steps of:
performing a third vertical etching, before performing the first vertical etching, on the back surface of the SOI-CMOS wafer and through a portion of the silicon layer, a portion of the insulation layer, and a portion of the dielectric layer to define a tunnel for reaching a sacrificial layer of the SOI-CMOS wafer; and
performing a wet etching via the tunnel to remove the sacrificial layer.

25. The method of claim 24, wherein the second vertical etching is performed before the first vertical etching.

26. The method of claim 19, wherein the first vertical etching includes a deep dry silicon etching process.

27. The method of claim 19, wherein the first vertical etching includes a deep reactive ion etching (DRIE).

28. The method of claim 19, wherein the second vertical etching includes a dry dielectric etching process.

29. The method of claim 19, wherein the second vertical etching includes a dry dielectric etching selected from a group consisting of a reactive ion etching (RIE), a reactive ion-beam etching (RIBE), a chemically assisted ion-beam etching (CAIBE), and combinations thereof.

30. The method of claim 19, wherein the removing step includes performing a wet etching on a front side of the SOI-CMOS wafer.

31. A method for manufacturing an uncooled infrared detector from a foundry-defined silicon-on-insulator (SOI) complementary metal oxide semiconductor (CMOS) wafer having a substrate layer, an insulation layer formed on the substrate layer and having a pixel region and a wall region surrounding the pixel region, a pixel structure formed on the pixel region of the insulation layer, a wall structure formed adjacent to the pixel structure and on the wall region of the insulation layer, a dielectric layer covering the pixel structure and the wall structure, a pixel mask formed within the dielectric layer and covering the pixel structure, and a wall mask formed within the dielectric layer and covering the wall structure, the method comprising the steps of:
performing a vertical etching through a portion of the dielectric layer not covered by the pixel mask and the wall mask and through a portion of the insulation layer not covered by the pixel mask and the wall mask, so as to define a front pixel space for separating the pixel structure from the wall structure;
removing the pixel mask and the wall mask; and
performing an anisotropic silicon etching to form a well on the substrate layer and under the pixel structure, the well defining a back pixel space joining the front pixel space for thermally isolating the pixel structure from the substrate layer and the wall structure.

32. The method of claim 31, further comprising the steps of:
depositing a photoresist layer to cover an input-output pad structure of the SOI-CMOS wafer before the vertical etching; and
removing the photoresist layer after the anisotropic silicon etching.

33. The method of claim 31, wherein the pixel structure and the substrate layer each has a floating potential during the anisotropic silicon etching.

34. The method of claim 31, wherein the pixel structure and the substrate layer have a substantially zero potential difference during the anisotropic silicon etching.

35. The method of claim 31, wherein the anisotropic silicon etching includes the step of:
exposing the SOI-CMOS wafer to a wet etching chemical selected from a group consisting of ethylenediamine pyrocatechol (EDP), tetramethylammonium hydroxide (TMAH), potassium hydroxide (KOH), and combinations thereof.

36. The method of claim 31, wherein the SOI-CMOS wafer further includes:
an amorphous silicon sacrificial layer covering the wall structure, and filling a space defined between the pixel structure and the wall structure, and
an umbrella layer covering the pixel structure and the amorphous silicon sacrificial layer.

37. The method of claim 36, wherein the anisotropic etching includes the steps of:
defining an aperture on the umbrella layer, the aperture vertically overlapping with a portion of the wall structure, and
introducing a wet chemical etchant via the aperture of the umbrella layer so as to etch away the amorphous silicon sacrificial layer covered by the umbrella layer.

38. The method of claim 31, wherein the vertical etching includes a dry dielectric etching process.

39. The method of claim 31, wherein the vertical etching includes a dry dielectric etching selected from a group consisting of a reactive ion etching (RIE), a reactive ion-beam etching (RIBE), a chemically assisted ion-beam etching (CAIBE), and combinations thereof.

40. The method of claim 31, wherein the removing step includes performing a wet etching on a front side of the SOI-CMOS wafer.

* * * * *